United States Patent
Hino

(10) Patent No.: US 7,301,414 B2
(45) Date of Patent: Nov. 27, 2007

(54) PLL CIRCUIT, RADIO-COMMUNICATION EQUIPMENT AND METHOD OF OSCILLATION FREQUENCY CONTROL

(75) Inventor: Takuo Hino, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 22 days.

(21) Appl. No.: 11/100,896

(22) Filed: Apr. 7, 2005

(65) Prior Publication Data

US 2005/0237125 A1    Oct. 27, 2005

(30) Foreign Application Priority Data

Apr. 26, 2004  (JP)  ............... 2004-129507

(51) Int. Cl.
*H03B 5/12*  (2006.01)

(52) U.S. Cl. .......................... 331/179; 331/16; 331/14; 331/11; 331/10

(58) Field of Classification Search ............... 331/179, 331/16, 40, 14, 11, 10
See application file for complete search history.

(56) References Cited

U.S. PATENT DOCUMENTS

| | | | | |
|---|---|---|---|---|
| 6,147,567 A | * | 11/2000 | Welland et al. ............. | 331/179 |
| 6,552,618 B2 | * | 4/2003 | Nelson et al. ................ | 331/11 |
| 6,563,387 B2 | * | 5/2003 | Hirano et al. ................. | 331/11 |
| 6,747,519 B2 | * | 6/2004 | Jaehne et al. ................. | 331/16 |
| 6,838,947 B2 | * | 1/2005 | Gomez ........................ | 331/17 |
| 6,888,413 B1 | * | 5/2005 | Adams et al. ................ | 331/17 |
| 2005/0237119 A1 | * | 10/2005 | Irie ............................. | 331/16 |

FOREIGN PATENT DOCUMENTS

| JP | 10-154934 A | 6/1998 |
|---|---|---|
| JP | 2003-152535 A | 5/2003 |

* cited by examiner

*Primary Examiner*—Robert Pascal
*Assistant Examiner*—Levi Gannon
(74) *Attorney, Agent, or Firm*—Akin Gump Strauss Hauer & Feld LLP

(57) ABSTRACT

A Phase-Locked Loop (PPL) circuit includes a voltage controlled oscillator (VCO), a reference signal oscillator, first and second frequency dividers, a phase comparator, a charge pump and a loop filter. The VCO has a plural number of oscillation frequency boards and oscillates according to a control voltage in a selected band. The first frequency divider frequency divides the output signal of the VCO. The second frequency divider frequency divides the reference signal outputted from the reference signal oscillator. The phase comparator detects the phase difference between the output signal of the first and second frequency dividers and outputs a phase difference signal. The charge pump inputs and outputs a current generated by a gain that was set depending on the selected band based on the phase difference signal. The loop filter increases or decreases the voltage with a specified low pass filter.

7 Claims, 15 Drawing Sheets

PLL CIRCUIT, RADIO-COMMUNICATION EQUIPMENT AND METHOD OF OSCILLATION FREQUENCY CONTROL

BACKGROUND OF THE INVENTION

The present invention relates to the PLL (Phase Locked Loop) circuit, radio communication equipment including mobile terminal and base station apparatus of mobile phone system and oscillation frequency control method thereof.

BRIEF SUMMARY OF THE INVENTION

In the radio communication systems such as the mobile terminal, it is important to produce the oscillation signal having a high stability. Therefore, these radio communication systems include highly stabilized PLL circuits.

A PLL frequency synthesizer circuit of the prior art 1 is disclosed in the Official Gazette of Japanese Unexamined Patent Publication No. 10-154934. FIG. 14 is a block diagram showing the configuration of a PLL frequency synthesizer circuit of the prior art 1. In FIG. 14, numeral 1 designates a voltage controlled oscillator (It is abbreviated as "VCO"), numeral 2 designates a frequency-divider dividing a frequency of the output of the voltage controlled oscillator, numeral 3 designates a reference signal oscillator, numeral 4 designates a frequency-divider dividing the frequency of a reference signal, numeral numeral 5 designates a phase comparator, numeral 1406 designates a charge pump that inputs and outputs a constant current according to the signal of the phase comparator, numeral 7 designates a loop filter, numeral 1401 designates an A/D converter circuit, and 1402 designates an arithmetic operation circuit.

The PLL frequency synthesizer circuit has an analog-to-digital conversion circuit 1401 which analog-to-digital-converts the output signal of the loop filter of the PLL circuit in the closed loop state, and an arithmetic operation circuit 1402 which analyzes the output signal of a digitized loop filter. The arithmetic operation circuit 1402 detects the transient response (i.e., the output signal of the loop filter) in the convergence process of the PLL circuit by executing the fast-sampling, based on the detected result, analyzing the loop characteristic of the PLL circuit, thereby the loop constant such as the gain of the phase comparator or the filter characteristic of the loop filter is controlled adequately. By this configuration, it is attempted to stabilize the PLL circuit.

In the Official Gazette of Japanese Unexamined Patent Publication No. 2003-152535, a semiconductor integrated circuit for the radio-use having the PLL circuit of the prior art 2 is disclosed. FIG. 15 is a block diagram showing the configuration of the PLL circuit of the semiconductor integrated circuit for the radio-use of the prior art 2. In FIG. 15, numeral 1 designates a voltage controlled oscillator (abbreviated as "VCO") having a plural number of bands (4 bands in Embodiment 1), numeral 2 designates a frequency divider dividing the frequency of the output of the voltage controlled oscillator, numeral 3 designates a reference signal oscillator, numeral 4 designates a frequency divider dividing the frequency of a reference signal, numeral 5 designates a phase comparator, numeral 1406 designates a charge pump which inputs and outputs a constant current according to the signal of the phase comparator, numeral 7 designates a loop filter, numeral 8 designates a switch, numeral 9 designates a constant voltage supply for supplying a first constant voltage, numeral 11 designates a frequency counter, numeral 12 designates an arithmetic operation circuit, numeral 13 designates a memory circuit, and numeral 14 designates a VCO selector circuit which selects a band of the voltage controlled oscillator.

In the PLL circuit of the semiconductor integrated circuit of the prior art 2 for radio use, it is possible to switch the oscillation frequency of the voltage controlled oscillator 1 selectively to any one of a plural number of oscillation frequency bands. In order to realize a broadband oscillation range together with the high stability of the oscillation frequency, the PLL circuit switches over the switch 8 so that the PLL circuit is turned to an open loop state and in each band of the voltage controlled oscillator 1, the frequency counter 11 counts the frequency of the output signal of the voltage controlled oscillator. The memory circuit 13 stores the count value (the oscillation frequency) of the frequency counter 11 with making it correspond to the band. The band selection circuit 14 compares an oscillation frequency band to be actually operated with a measured value of a frequency that was stored beforehand in the memory circuit 13 and from the comparison result determines an oscillation frequency band to be actually used.

In the semiconductor integrated circuit for radio use having the PLL circuit of the prior art 2, it was necessary to store which band of the voltage controlled oscillator to be used for all the oscillation ranges to be used in a memory circuit. Therefore, it necessitates a time for measuring the oscillation frequency in each band in turn before the PLL circuit to be locked and storing those measured data in the IC including the PLL circuit with keeping the correspondence thereof to each band, or in the final inspection process before the shipment of ICs, process is necessary for measuring the oscillation frequency in each band of the voltage controlled oscillator and storing those frequencies in the memory circuit keeping the correspondence of the oscillation frequency to each band.

Also, because of the reason mentioned below, there has been a problem that the slope (hereinafter denoted by Kv) of frequency versus frequency control voltage characteristic of the voltage-controlled oscillator varies at each band. In a voltage-controlled oscillator having a plural number of bands, oscillation frequency is typically determined by the resonance of an inductor and a capacitive element. As for the capacitive element, varactor diodes, for example, of which capacitance can be changed responding to the frequency control voltage, is used.

In a voltage controlled oscillator having a plural number of bands, it is provided with a circuit wherein a varactor diode and a plural sets of series-connected units of fixed capacitors and switches are connected in parallel. By selectively turning on and off the switches of the series-connected units responding to the band-selection command, sums of capacitances of the varactor diode and fixed capacitor are variably switched over. By this switching-over of the sum-capacitances of the varactor diodes and of the fixed capacitors, the oscillation frequency is made shifted. However, when the bands are switched over, variation characteristic of the sum-capacitance (variation factor of the sum capacitance) of the varactor diodes and the fixed capacitors with respect to the frequency-control voltage is changed. This is because that, while the capacitance of the varactor diode varies responding to the frequency control voltage, capacitance of the fixed capacitance is constant. Due to this fact, Kv varies depending on the band to be selected.

Due to this variation of Kv, there have been problems such that the C/N characteristics at the time of locking of the PLL circuit and/or the lock-up time necessary for reaching the locking vary. As the oscillation frequency expands and the number of bands increases, the difference between Kvs at the lowest band and at the highest band becomes large. Therefore, it was difficult to realize a stable PLL circuit having a plurality of bands having a suitable response characteristic over all bands.

It might be considered to introduce the configuration of the PLL circuit of the prior art 1 into the PLL circuit of the prior art 2. However, in order to measure a minute voltage variation of the output of the loop filter in the closed loop state by an analog-to-digital conversion circuit, a high precision and high-speed operation analog-to-digital converter is required. The necessary control arithmetic operation circuit thereof also becomes complicated. To realize a configuration in which a digital signal processor (hereinafter abbreviated as DSP) can control the characteristics of a loop filter based on measured results from an analog-to-digital conversion circuit, a lot of parts such as variable resistors, PIN diodes becomes necessary for realizing the control by the DSP.

In the configuration of the prior art 1, since the time such as the conversion time of the analog-to-digital conversion circuit or the time necessary for complicated computations done by the DSP was needed, a certain time period was required before the PLL circuit is locked to reach a stable operation. Therefore, it was difficult to introduce the configuration of the prior art 1 into the voltage controlled oscillator in which the bands may be switched over during the actual user's usage of the system or to introduce it into the PLL circuit having a high-speed lock operation capability. And, even if the configuration of the prior art 1 is supposed to have been able to be introduced into the PLL circuit, there has been another problem that the PLL circuit becomes expensive.

BRIEF SUMMARY OF THE INVENTION

The present invention intends to provide a low cost and stable PLL circuit in which the selectively switching over to any one of a plural number of oscillation frequency ranges (hereinafter referred to as bands) and in any band, C/N characteristic and lock-up time when the PLL is in the locked state are almost constant, as well as to provide a radio communication equipment having such the PLL circuit mentioned above and an oscillation frequency control method thereof.

To solve the above problems, the present invention has the following configuration. The invention stated in claim 1 is a PLL circuit comprising a voltage controlled oscillator having a plural number of bands, which oscillates at a frequency according to the control voltage in the selected band, a first frequency divider frequency-dividing the output signal of said voltage controlled oscillator, a reference signal oscillator, a second frequency divider frequency-dividing the reference signal outputted from said reference signal oscillator, a phase comparator detecting the phase difference between the output signal of said first frequency divider and the output signal of the said second frequency divider and outputting the phase difference signal, a charge pump that inputs and outputs a current generated by a gain that was set depending on the selected band based on said phase difference signal, and a loop filter which increases or decreases the voltage with a specified low pass filter characteristic by a current which said charge pump inputs and outputs, and thereby generates said control voltage By setting the gain of the charge pump according to the band, the slope Kv in the characteristics of oscillation frequency versus frequency control voltage of the voltage controlled oscillator in each band becomes approximately constant. In accordance with the present invention, a low-cost and stable PLL circuit can be realized, in which the C/N characteristics at the time of locking of the PLL circuit and the lock-up time necessary for reaching the locking and so on are set to be optimum in all bands.

The invention stated in claim 2 is a PLL circuit claimed in claim 1 comprising a frequency measurement unit to which said reference signal or a frequency-divided signal of said reference signal and the output signal of said voltage controlled oscillator or a frequency-divided signal thereof are inputted, and which measures the frequency of the output signal of the voltage controlled oscillator or of the frequency-divided signal thereof based on said reference signal, or the frequency-divided signal of said reference signal, and a band selection unit selecting a band on which said voltage-controlled oscillator operates according to the frequency measured by said frequency measurement unit.

The invention stated in claim 3 is a PLL circuit claimed in claim 1 which is characterized in that said charge pump inputs and outputs a current that was set depending on the selected band in the time period according to said phase difference signal.

The invention stated in claim 4 is a PLL circuit claimed in claim 1 further comprising a switch inserted between said loop filter and said voltage controlled oscillator, and wherein said switch selects and outputs either the output voltage of said loop filter or the first constant voltage as the control voltage to said voltage controlled oscillator.

The invention stated in claim 5 is a PLL circuit claimed in claim 1 further comprising a switch inserted between said loop filter and said voltage controlled oscillator, and Wherein said switch selectively outputs a voltage selected from the output voltage of said loop filter, the first constant voltage, and one or plural number of the second constant voltage as the control voltage to said voltage controlled oscillator.

The invention stated in claim 6 is a radio communication equipment which has the PLL circuit claimed in any of claim 1 to claim 5, and modulates the input signal with the output signal of said voltage controlled oscillator or with the frequency-divided signal thereof which was outputted from said PLL circuit and radio-transmit it, or demodulates the radio-received input signal.

The invention stated in claim 7 is a radio communication equipment claimed in claim 6 characterized in that said radio communication equipment is either of a mobile terminal or a base station apparatus of a mobile telephone system.

The invention of claim 8 is an oscillation frequency control method comprising an oscillation step of making the voltage controlled oscillator having a plural number of bands oscillate in the selected band, a first frequency-dividing step to divide the frequency of the output signal of said voltage controlled oscillator, a second frequency-dividing step to divide the frequency of the reference signal, a phase comparing step of detecting the phase difference between the frequency-divided signal in said first frequency-dividing step and the frequency-divided signal in said second frequency-dividing step and for outputting the phase difference signal, a current driving step for inputting and outputting a current generated at a gain which was set depending on the selected band based on said phase difference signal, and a control voltage generation step for generating a control voltage of said voltage controlled oscillator by increasing or decreasing the voltage with a specified low-pass filter characteristic by the current inputted and outputted at said current driving step.

The invention stated in claim 9 is a oscillation frequency control method claimed in claim 8 which is characterized in that a current inputs and outputs a current that was set responding to the band selected in the time period according to said phase difference signal said current driving step.

The invention stated in claim 10 is an oscillation frequency control method claimed in claim 8 further comprising a first frequency measurement step in which, under the condition that said voltage-controlled oscillator is set to a specified band and said control voltage of a constant value is applied, said reference signal or the frequency-divided signal of said reference signal and the output signal of said voltage controlled oscillator or the frequency-divided signal thereof are inputted, and based on said reference signal or the frequency-divided signal of said reference signal, the frequency of the output signal of said voltage controlled oscillator or of the frequency-divided signal thereof is measured, and a band-selection step to select a band in which said voltage controlled oscillator operates according to the frequency measured in said first frequency measurement step.

The invention stated in claim 11 is an oscillation frequency control method claimed in claim 8 comprising a second frequency measurement step of measuring the oscillation frequency of said voltage controlled oscillator by applying the first constant voltage as said control voltage in the selected band, a third frequency measurement step of measuring the oscillation frequency of said voltage controlled oscillator by applying the second constant voltage as said control voltage in the selected band, a gain setting step to set the gain at said current driving step in the band, based on the difference between the measured oscillation frequency in said second frequency measurement step and the measured oscillation frequency in said third frequency measurement step, and a step to make said voltage-controlled oscillator oscillate by inputting and outputting the current generated at the gain that was set based on said phase difference signal in said current driving step, and by impressing the output voltage of the above-mentioned control voltage generation step as said control voltage.

The invention stated in claim 12 is an oscillation frequency control method claimed in claim 8 comprising a second frequency measurement step of measuring the oscillation frequency of said voltage controlled oscillator by applying the first constant voltage as said control voltage in the selected band, a fourth frequency measurement step of measuring the oscillation frequency of said voltage controlled oscillator by applying the output voltage of said control voltage generation step in the selected band, a fifth frequency measurement step in which, in the selected band, when the frequency measured in the fourth frequency measurement step is higher than the frequency measured in the second frequency measurement step, a constant voltage higher by the amount of a specified voltage than said first constant voltage is selected, while when the frequency measured in the fourth frequency measurement step is lower than the voltage measured in the second frequency measurement step, a constant voltage lower by a specified voltage than said first constant voltage, and then the selected constant voltage is applied as said control voltage, thereby the oscillation frequency of said voltage controlled oscillator is measured, a gain setting step to set the gain at said current driving step in the band, based on the frequency difference between the measured oscillation frequency in said second frequency measurement step and the measured oscillation frequency in said fifth frequency measurement step, and a step to make said voltage controlled oscillator oscillate by inputting and outputting the current generated at the gain that was set based on said phase difference signal in said current driving step, and then by applying the output voltage of said control voltage generation step as said control voltage.

The invention stated in claim 13 is an oscillation frequency control method characterized in that, when power is turned on, it executes one of those oscillation frequency control methods claimed in any one of claim 10 to claim 12 is executed having a specified frequency as a target frequency, a band including a target frequency is selected, and then the gain in said current driving step is set.

The invention stated in claim 14 is an oscillation frequency control method further comprising a step to prohibit or permit the band selection action and the gain setting action in said current driving step, and wherein only when the band selection action and the gain setting action in said current driving step are permitted, the oscillation frequency control method claimed in any one of claim 10 to claim 12 is executed.

The invention stated in claim 15 is an oscillation frequency control method further comprising a step to execute the oscillation frequency control method claimed in any claim of claim 8 to claim 12 so that said voltage controlled oscillator oscillates at a specified target frequency at the time when the power source is turned on, and a step in which, in case that a new target frequency is set, based on the new target frequency, or based on a difference between the new target frequency and said specified target frequency, the band selection and the gain setting in said current driving step are executed using a specified arithmetic expression or a specified table.

The invention stated in claim 16 is an oscillation frequency control method characterized in that it selectively executes a step to read to set the gain of said current driving step corresponding to the selected band from a memory storing the gain of said current driving step for respective bands, and to execute the oscillation frequency control method claimed in claim 8, and a step to execute the oscillation frequency control method claimed in any one of claim 10 to claim 12.

The invention stated in claim 17 is an oscillation frequency control method claimed in any one of claim 10 to claim 12 characterized in that, when switching over from the step for measuring the oscillation frequency of said voltage controlled oscillator by applying a constant voltage as said control voltage to the step for making said voltage controlled oscillator oscillate by applying the output voltage of said control voltage generation step as said control voltage, the gain of said current driving step is high transiently set, and after a specified time lapses or after the oscillation frequency of said voltage controlled oscillator was locked in a certain specified range of error with respect to a target frequency, the gain of said current driving step is set to a value responding to said selected band.

The invention stated in claim 18 is an oscillation frequency control method comprising a radio communication step to modulate the input signal by an output signal of the voltage controlled oscillator or a frequency-divided signal thereof for the radio-transmission, or to demodulate the radio-received input signal, and an adjustment step to execute the oscillation frequency control method claimed in any one of claim 10 to claim 12 during the period while said radio communication step is not executed.

The invention stated in claim 19 is an oscillation frequency control method claimed in claim 18 characterized in that said adjustment step is executed during the period while said radio communication is not executed and the oscillation frequency of said voltage controlled oscillator deviates more than a specified threshold value from the target frequency.

In accordance with the present invention, it is possible to realize a low cost and stable PLL circuit in which selective switching over to a plural number of bands is possible, and in either of those bands, the C/N characteristics when the PLL is in the locked state and the lock-up time become almost the same, and also it is possible to realize a radio communication equipment having the above PLL circuit and an oscillation frequency control method thereof.

When the band is switched over, it is also possible to obtain a stable characteristics of C/N, lock-up time, etc. even in case that Kv of the voltage-controlled oscillator changes.

It is also possible, by selectively using the case to do an optimum setting of band as well as of the charge pump current and the case to operate the PLL circuit in an already set condition, it becomes possible to realize a PLL circuit which is responding to a faster lock-up time as well as a radio communication equipment having the above PLL circuit and an oscillation frequency control method thereof.

While the novel features of the invention are set forth particularly in the appended claims, the invention, both as to organization and content, will be better understood and appreciated, along with other objects and features thereof, from the following detailed description taken in conjunction with the drawings.

It will be recognized that some or another Figures are schematic representations for purposes of illustration and do not necessarily depict the actual relative sizes or locations of the elements shown.

DETAILED DESCRIPTION OF THE INVENTION

The followings describe along with the drawings on embodiments specifically showing the best mode to implement the present invention.

Embodiment 1

Figure 1:
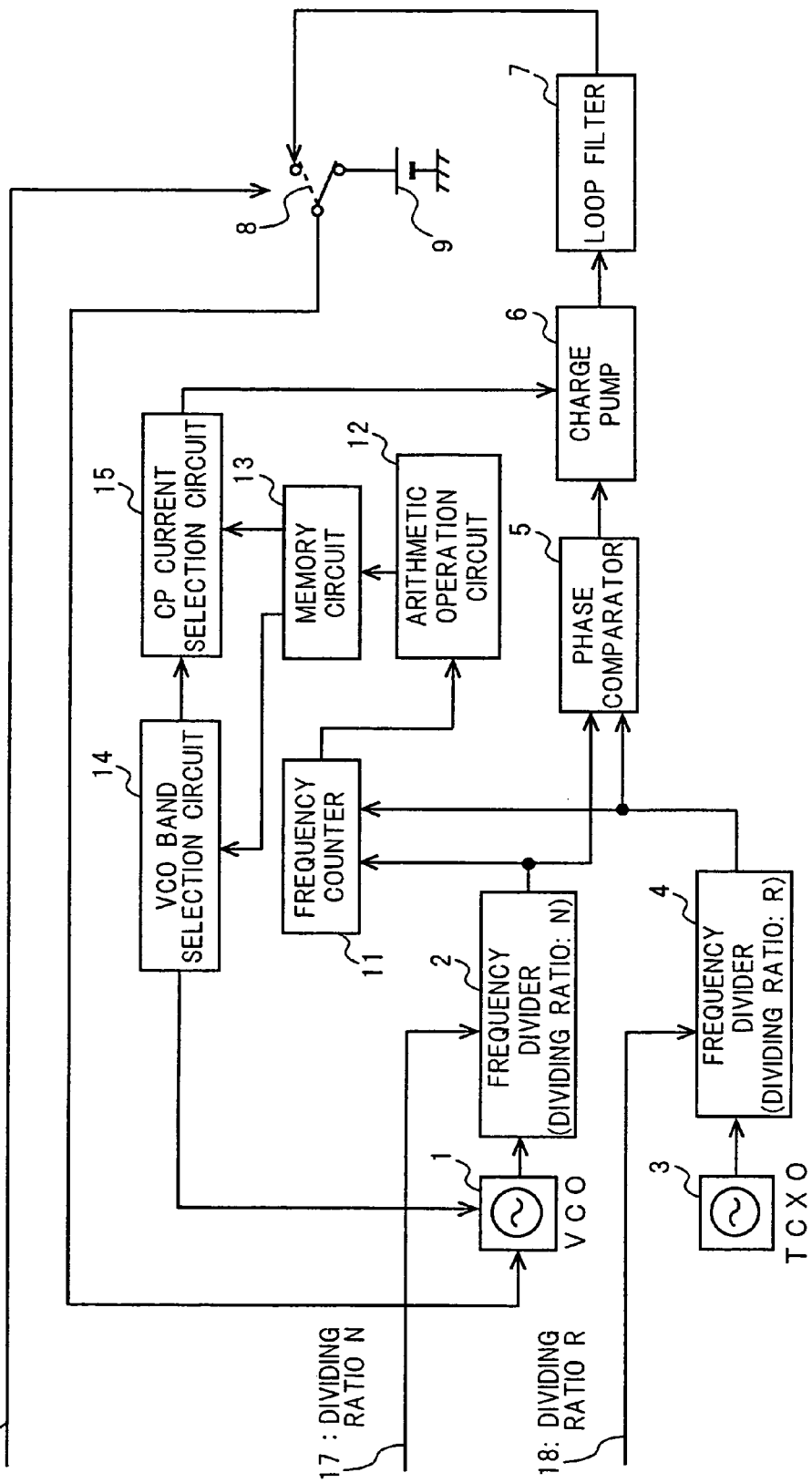
FIG. 1 is a block diagram showing the configuration of a PLL circuit of an embodiment 1 of the present invention.

A PLL circuit, a radio communication equipment, and an oscillation frequency control method of Embodiment 1 of the present invention are described using FIG. 1 to FIG. 7. FIG. 1 is a block diagram showing the configuration of a PLL circuit 601 of Embodiment 1 of the present invention. In FIG. 1, numeral 1 designates a voltage controlled oscillator (abbreviated as VCO) having a plural number of bands (4 bands in Embodiment 1), numeral 2 designates a frequency divider dividing the frequency of the output of the voltage controlled oscillator, numeral 3 designates a reference signal oscillator, numeral 4 designates a frequency divider dividing the frequency of the reference signal, numeral 5 designates a phase comparator, numeral 6 designates a charge pump to input and output a constant current responding to the signal of the phase comparator, numeral 7 designates a loop filter, numeral 8 designates a switch, numeral 9 designates a constant voltage source supplying a first constant voltage, numeral 11 designates a frequency counter numeral 12 designates an arithmetic operation circuit, numeral 13 designates a memory circuit, numeral 14 designates a VCO selection circuit selecting a band of the voltage controlled oscillator, and numeral 15 designates a current control circuit of the charge pump (abbreviated as CP current control circuit).

As is described later in FIG. 6, the PLL circuit 601 of Embodiment 1 is installed in a radio communication equipment. The control unit 602 (FIG. 6) of the radio communication equipment sends out a switching signal 16, a setting signal 17 of a frequency dividing ratio N, and a setting signal 18 of a frequency dividing ratio R, and controls the PLL circuit 601.

In the PLL circuit 601 of Embodiment 1 of the present invention, semiconductor element of the voltage controlled oscillator 1, the frequency divider 2, semiconductor element of the reference signal oscillator 3, the frequency divider 4, the phase comparator 5, the charge pump 6, the switch 8, the constant voltage source 9, the frequency counter 11, the arithmetic operation circuit 12, the memory circuit 13, the VCO selection circuit 14, and the CP current control circuit 15 are integrated into a single IC chip. The PLL circuit of Embodiment 1 is a stable and low cost PLL circuit in which, notwithstanding Kv of the voltage controlled oscillator 1 changes responding to a band selected, such characteristics as the C/N characteristic at the time of locking and the lock-up time necessary for reaching the locking are set most suitably in all bands.

The PLL circuit of Embodiment 1 is described. At first, explanation is given on an operation state that the switch 8 sends the control voltage outputted from the loop filter 7 to the voltage controlled oscillator 1.

Figure 2:
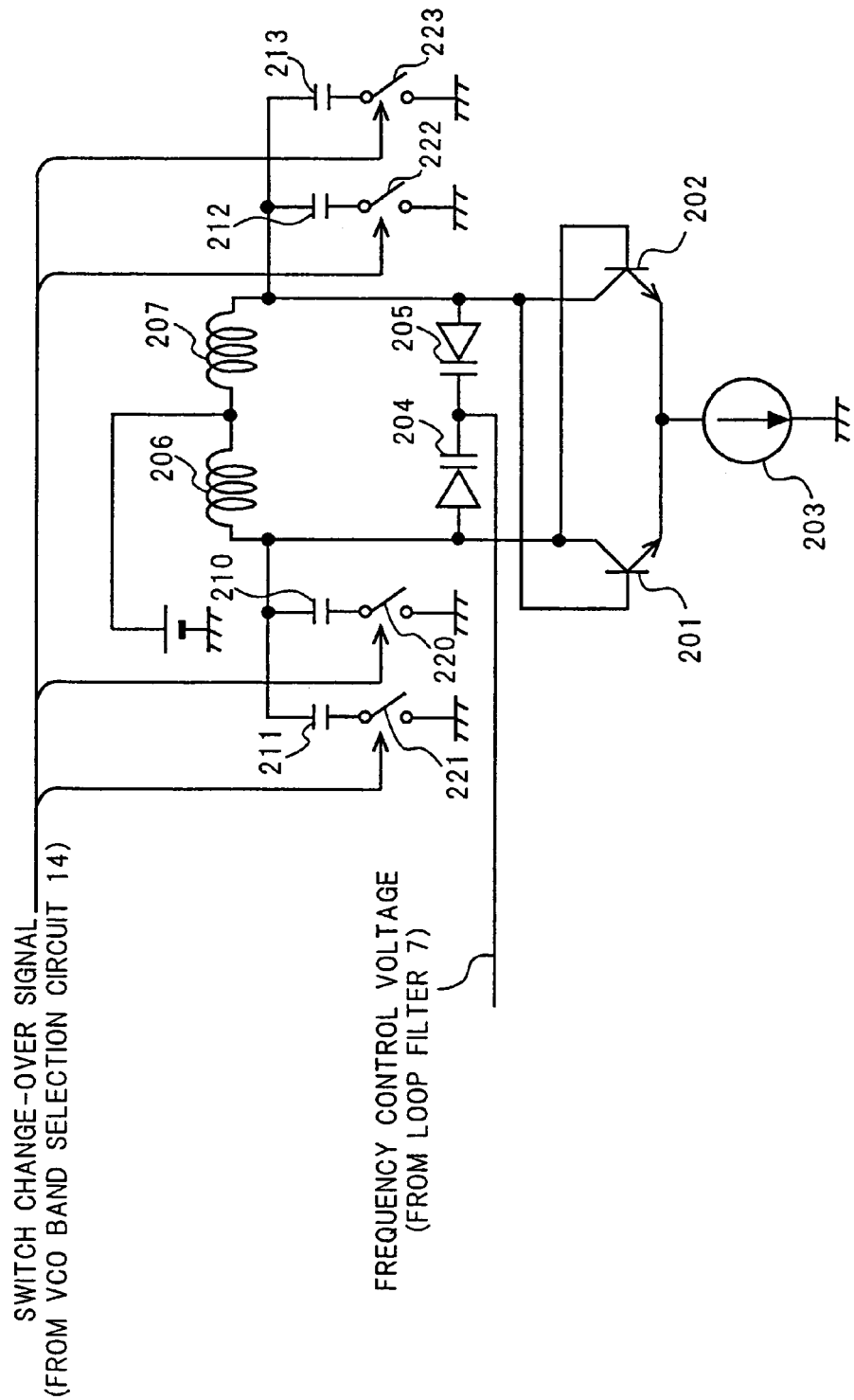
FIG. 2 is a schematic block diagram showing the configuration of a voltage controlled oscillator of the embodiment 1 of the present invention.
Figure 3:
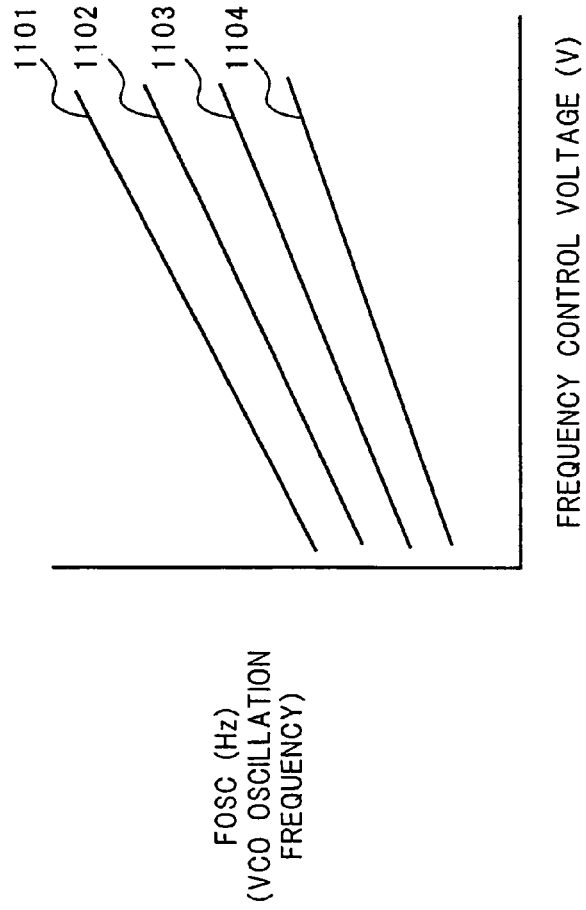
FIG. 3 is a drawing showing the characteristics of respective bands of the voltage controlled oscillator of the embodiment 1 of the present invention.

The voltage controlled oscillator 1 is described using FIG. 2 and FIG. 3. FIG. 2 is a schematic circuit diagram showing the configuration of main part of the voltage controlled oscillator 1. In the voltage controlled oscillator 1, two transistors 201 and 202 compose an amplifier in which emitters thereof are connected to a current source 203. A parallel resonant circuit is connected to collectors of transistors 201 and 202. The parallel resonant circuit has a configuration of a parallel connection of four series-connected units, which are respectively series connections of inductors 206, 207, varactor diodes 204, 205, and fixed capacitive elements (capacitors) 210, 211, 212, and 213, and band changeover switches (hereinafter, abbreviated as "switch") 220, 221, 222, and 223. The capacitances of the capacitors 210 and 212 are identical. The capacitors 211 and 213 are identical. The capacitance of the capacitor 210 is smaller than that of the capacitor 211.

The voltage controlled oscillator 1 oscillates in a resonant frequency fOSC of the parallel resonant circuit and outputs the signal of a frequency fOSC. The VCO band selection circuit 14 sets switches 220, 221, 222, and 223 ON or OFF so that the fixed capacitors 210, 211, 212, and 213 connected to the parallel resonant circuit are changed over. Thereby the band in which the voltage controlled oscillator 1 oscillates is changed over. In respective bands, by impressing the output voltage of the loop filter 7 to the cathodes of the varactor diodes 204, 205 as the frequency-control voltage through the switch 8, the capacitance of the varactor diodes 204, 205 changes and hence the frequency fOSC at which the voltage-controlled oscillator 1 oscillates changes.

FIG. 3 is a drawing showing the characteristics of respective bands of the voltage-controlled oscillator 1. In FIG. 3, the abscissa shows the frequency-control voltage (in unit of volt, V) that the loop filter 7 outputs, and the ordinate shows the oscillation frequency fOSC (in unit of Hz) of the voltage controlled oscillator 1. The slope of each line of FIG. 1 is Kv (in unit of Hz/V). A line 1101 shows the oscillation frequencies when all the switches 220, 221, 222, and 223 are turned off. A line 1102 shows the oscillation frequencies when the switches 220, and 222 are turned on and the switches 221, and 223 are turned off. A line 1103 shows the oscillation frequencies when the switches 221, and 223 are turned on and the switches 220, and 222 are turned off. A line 1104 shows the oscillation frequencies when all the switches 220, 221, 222, 223 on.

The reference signal oscillator 3 is a high-accuracy and high-stable oscillator using a surface acoustic wave (SAW) filter. The reference signal oscillator 3 oscillates at a constant frequency fSTD and outputs a reference signal of the frequency fSTD.

The control unit 602 (FIG. 6) of the radio communication equipment sets the frequency dividing ratio N of the frequency divider 2. The frequency divider 2 divides the frequency of the output signal of the voltage controlled oscillator 1 by the frequency dividing ratio N. The control unit 602 sets the frequency dividing ratio R of the frequency divider 4. The frequency divider 4 divides the frequency of the output signal of the reference signal oscillator by the frequency dividing ratio R.

The control unit 602 determines the values of frequency dividing ratios N and R according to the frequencies (for example, four frequencies) of the output signal of the PLL circuit 601. The control unit 602 determines the values of the dividing ratios N and R so that the frequency of the output signal of frequency divider 2 and the frequency of the output signal of the frequency divider 4 become identical at each frequency. That is, it determines the values of the dividing ratios N and R so that the following equation holds;

$$fOSC/N = fSTD/R$$

The phase comparator 5 inputs the output signal of the frequency divider 2 and the output signal of the frequency divider 4 and outputs a phase difference signal according to the phase difference between the two signals. In Embodiment 1, the phase difference signal consists of two phase difference signals 46 and 47. If a frequency fOSC/N of the output signal of the frequency divider 2 is higher than a frequency fSTD/R of the output signal of the frequency divider 4, the phase difference signal 47 (FIG. 4) becomes High with a time duration proportional to this frequency difference. If the frequency fOSC/N of the output signal of the frequency divider 2 is lower than the frequency fSTD/R of the output signal of the frequency divider 4, the phase difference signal 46 (FIG. 4) becomes High with a time duration proportional to the frequency difference. During the time period other than the above, the phase difference signals 46 and 47 become Low.

The frequency counter 11 and the arithmetic operation circuit 12 compose a frequency measurement unit. The frequency measurement unit inputs the divided signal of the reference signal and the divided signal of the output signal of voltage controlled oscillator 1 and measures the frequency of the divided signal of the output signal of the voltage controlled oscillator 1 based on the divided signal of the reference signal. In place of the composition of Embodiment 1, it is also possible that the frequency measurement unit measures the frequency of the output signal of the voltage controlled oscillator 1 based on the reference signal by directly inputting the reference signal and the output signal of the voltage controlled oscillator 1.

The frequency counter 11 has a first counter to input the output signal of the frequency divider 2 to a clock input terminal thereof and a second counter to input the output signal of the frequency divider 4 to a clock input terminal thereof. In Embodiment 1, the first counter and the second counter of the frequency counter 11 output respectively pulses of width corresponding to certain values. The frequency counter 11 outputs a first finite difference pulse resulted from a subtraction of the second pulse from the first pulse and a second finite difference pulse resulted from a subtraction of the first pulse from the second pulse. The time duration of the first finite difference pulse is proportional to a frequency difference when the frequency fOSC/N of the output signal of the frequency divider 2 is lower than the frequency fSTD/R of the output signal of the frequency divider 4. The time duration of the second finite difference pulse is proportional to the frequency difference when the frequency fOSC/N of the output signal of the frequency divider 2 is higher than the frequency fSTD/R of the output signal of frequency divider 4. Only either one of the first finite difference pulse and the second finite difference pulse is outputted.

The arithmetic operation circuit 12 inputs the first finite difference pulse and the second finite difference pulse, and when inputting the signals that the center frequencies of two adjacent VCO bands are respectively divided by N into the frequency counter 11, it counts the time duration of the first finite difference pulse or the second finite difference pulse with the clock having a period of reciprocal integer number times of the time duration of the first finite difference pulse (or the second finite difference pulse) that the frequency counter 11 outputs. The count value is proportional to the amount of deviation between the setting band and the best-fit band. The count value is stored in the memory circuit 13.

The configuration of the frequency counter 11 and the arithmetic operation circuit 12 is not necessarily limited to the above-mentioned configuration, any arbitrary configuration may be used.

The memory circuit 13, the VCO band selection circuit 14, and the CP current selection circuit 15 compose a band selection unit. Responding to the count value of the time duration of the first finite difference pulse or the second finite difference pulse which was measured by the frequency measurement unit, the voltage controlled oscillator 1 selects a band to be used and sets the value of current of the charge pump 6.

The VCO band selection circuit 14 determines a best-fit band according to the count value stored in the memory circuit 13. The VCO band selection circuit 14 outputs the switchover signal switching over the switches 220, 221, 222, and 223 (FIG. 2) and selects the band of the voltage controlled oscillator 1. VCO band selection circuit 14 transmits the information on the selected band to the CP current selection circuit 15.

The CP current selection circuit 15 outputs the setting data 48 for determining the input/output current of the charge pump 6 that was stored beforehand in the memory circuit 13 according to the information on a selected band sent from the VCO band selection circuit 14 and transmits it to the charge pump 6 as the control signal. In Embodiment 1, the setting data (the control signal) 48 is a plural number of bits of the control signal for determining the current of the variable current source 41 (FIG. 4) included in the charge pump 6.

The charge pump 6 inputs the phase difference signal outputted from the phase comparator 5 and the control signal for determining the input/output current outputted from the CP current selection circuit 15, and inputs and outputs the current set responding to the selected band to the loop filter 7 in the time period according to the phase difference signal.

Figure 4:
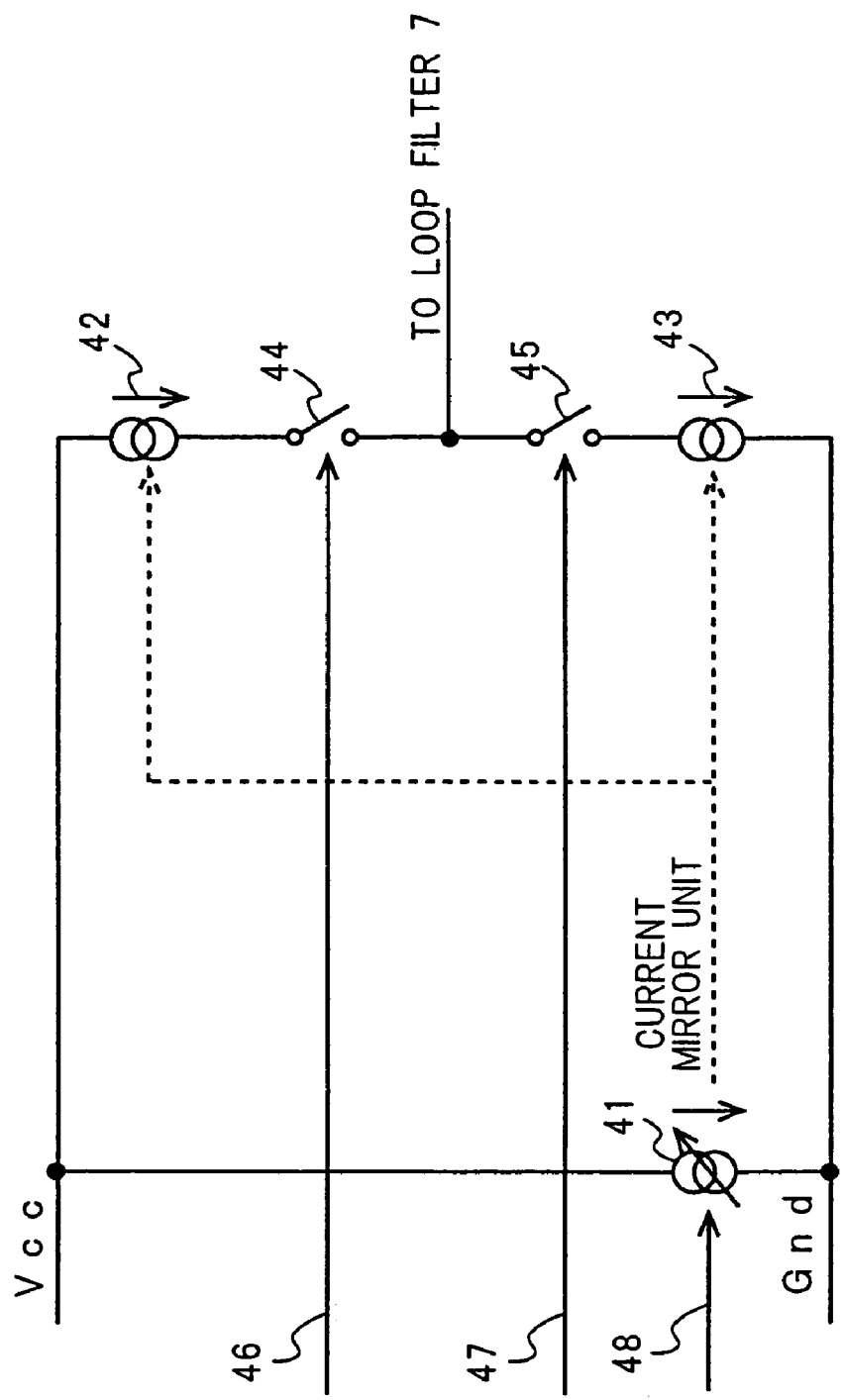
FIG. 4 is a schematic block diagram showing the configuration of a charge pump of the embodiment 1 of the present invention.

FIG. 4 is a schematic circuit drawing showing the configuration of the charge pump 6 of Embodiment 1. In FIG. 4, the charge pump 6 has current, sources 41, 42, and 43, and switches 43, and 44. The current source 41 supplies a constant current responding to the setting data 48 determining the input/output current that the CP current selection circuit 15 outputs. In Embodiment 1, as the frequency of the band that the VCO band selection circuit 14 selected is high, the current supplied by the current source 41 becomes small.

The current sources 41, 42, and 43 compose a mirror circuit and the current sources 42 and 43 output constant currents proportional to the output current of the current source 41. The current sources 42 and 43 output the current of the same value. Therefore, by changing the current of the current source 41, the current value of the current sources 42 and 43 also changes.

When the frequency fOSC/N of the output signal of the frequency divider 2 is lower than the frequency fSTD/R of the output signal of the frequency divider 4 and the phase comparator 5 outputs a high level phase difference signal 46, the switch 44 turns on. Through the constant current source 42 and the switch 44, the capacitor 53 (FIG. 5) of the loop filter 7 is charged. In proportion to the ON period of the switch 44, voltage of the capacitor 53 of the loop filter 7 becomes high.

When the frequency fOSC/N of the output signal of the frequency divider 2 is higher than the frequency fSTD/R of the output signal of the frequency divider 4 and the phase comparator 5 outputs a high level phase difference signal 47, the switch 45 turns on. Through the switch 45 and the constant current source 43, the capacitor 53 (FIG. 5) of the loop filter 7 is discharged. In proportion to the ON period of the switch 45, voltage of the capacitor 53 of the loop filter 7 becomes low.

Figure 5:
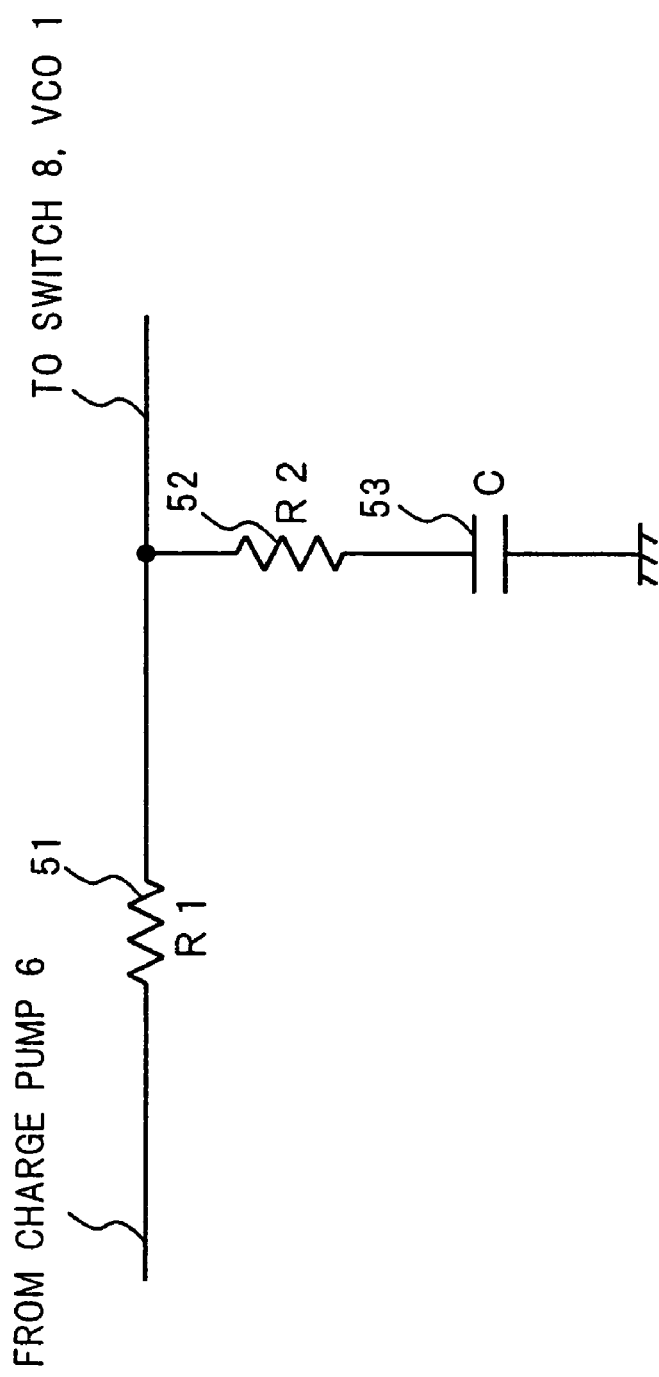
FIG. 5 is a schematic circuit diagram showing the configuration of a loop filter of the embodiment 1 of the present invention.

FIG. 5 is a schematic circuit diagram showing the configuration of the loop filter 7 of Embodiment 1. The loop filter 7 is a low pass filter. The loop filter 7 has resistors 51, 52 and a capacitor 53. The capacitor 53 is charged and discharged by the charge pump 6. The voltage appearing on both ends of the capacitor 53 is applied to the voltage control oscillator 1 through the switch 8.

When the applied control voltage becomes high, the oscillation frequency of the voltage controlled oscillator 1 becomes high and when the control voltage becomes low, the oscillation frequency of the voltage controlled oscillator 1 becomes low.

Explanation is given on the set value of the input/output current of the charge pump 6 that is set by the CP current selection circuit 15. In the voltage controlled oscillator 1 having the configuration of FIG. 2, Kv becomes higher in a band where the frequency is high than that in a band where the frequency is low as shown in FIG. 3. As the frequency selected by the VCO band selection circuit 14 is higher, the input/output current of the charge pump 6 set by the CP current selection circuit 15 is made to be smaller. Specifically, as the frequency of the band selected by the VCO band selection circuit 14 is higher, the current supplied by the current source 41 of the charge pump 6 is set smaller. That is, as the frequency of the selected band is higher, the gain by which the input/output current is generated based on the phase difference signal is set lower.

As the frequency of the band selected by the VCO band selection circuit 14 is lower, the input/output current of the charge pump 6 set by the CP current selection circuit 15 is made larger. Specifically, as the frequency of the band selected by the VCO band selection circuit 14 is lower, the current supplied by the current source 41 of the charge pump 6 is made larger. That is, as the frequency of the selected band is higher, the gain by which the input/output current is generated based on the phase difference signal is set higher.

In each bands, such the values by which Kv×the value of the charge pump current become approximately constant are stored beforehand in the memory circuit 13. As a result, stable C/N and lock-up time can be obtained in the respective bands.

Let the conversion-gain of the charge pump by which the difference signal outputted by the phase comparator is converted into the input/output current be Ikp (mA/rad), the control sensitivity of the VCO be Kv (Hz/V), the loop filter function (Laplace function) be F(s), the frequency dividing ratio of the frequency divider prepared for the VCO output be 1/N. The open loop gain of the feedback loop of the PLL circuit of Embodiment 1 is expressed by the following expression;

$G(s)/(1+G(s) \times H(s))$, where G(s), H(s) are $G(s) = IKp \times Kv \times F(s)/s$, $H(s) = 1/N$.

Hereupon, for the loop filter, using the second order complete-integral type as shown in FIG. 5 and letting resistance values of the resistors 51, and 52 be R1, and R2 the and capacitance of the capacitor 53 be C, the transfer function of F(s) is expressed by the following equation;

$F(s) = (s \cdot C \cdot R2 + 1)/(s \cdot C \cdot R1)$.

The eigen frequency ωn and the dumping constant ξ which are important elements on knowing pulling-in time, the steady state or the likes of the PLL circuit using these values are expressed by the following equations;

$$\xi = (R1 \times C/2) \times (IKp \times Kv/(N \times C \times R1))1/2,$$

$$\omega n = (IKP \times Kv/(N \times C \times R1))1/2.$$

In Embodiment 1, determining the band of the voltage controlled oscillator, then the input/output current of the constant voltage type charge pump is changed responding to the value of Kv in the band. In the prior art, for example, by changing the resistor 51 of the loop filter 7 and the impedance of the capacitor 53 of FIG. 5, the variations of Kv in the band is compensated. However, the cutoff frequency of the loop filter 7 is changed, thereby the transfer function of the PLL circuit also changes. In the present invention, since the gain of the loop filter is changed without changing the characteristic of the loop filter 7, it becomes possible to keep the loop gain of the PLL circuit constant and to get rid of the variation in the circuit characteristic. The PLL circuit of Embodiment 1 can be operated stably in all bands.

In Embodiment 1, it is conceivable to employ a method in which, for example, without using the switch 8 or the constant voltage source 9, the VCO band selection circuit 14 selects first the lowest frequency band, then detects whether the PLL circuit is locked or not locked at that band, and then if not locked, the band is successively changed to a band of higher frequency band one by one until the optimum band is detected. However, this method takes time to detect the optimum band. The PLL circuit of Embodiment 1 further comprises the switch 8 and the constant voltage source 9. Thus, the optimum band can be detected promptly.

The switch 8 sends the control voltage outputted by the loop filter 7 to the voltage controlled oscillator 1 in the normal operation state. When detecting the optimum band, the switch 8 first sends the output voltage of the constant voltage source 9 to the voltage controlled oscillator 1 as the control voltage in place of the output voltage of the loop filter. The function in the case that the switch 8 sends the output voltage of the constant voltage source 9 to the voltage controlled oscillator 1 as the control voltage is explained in FIG. 7.

Figure 7:
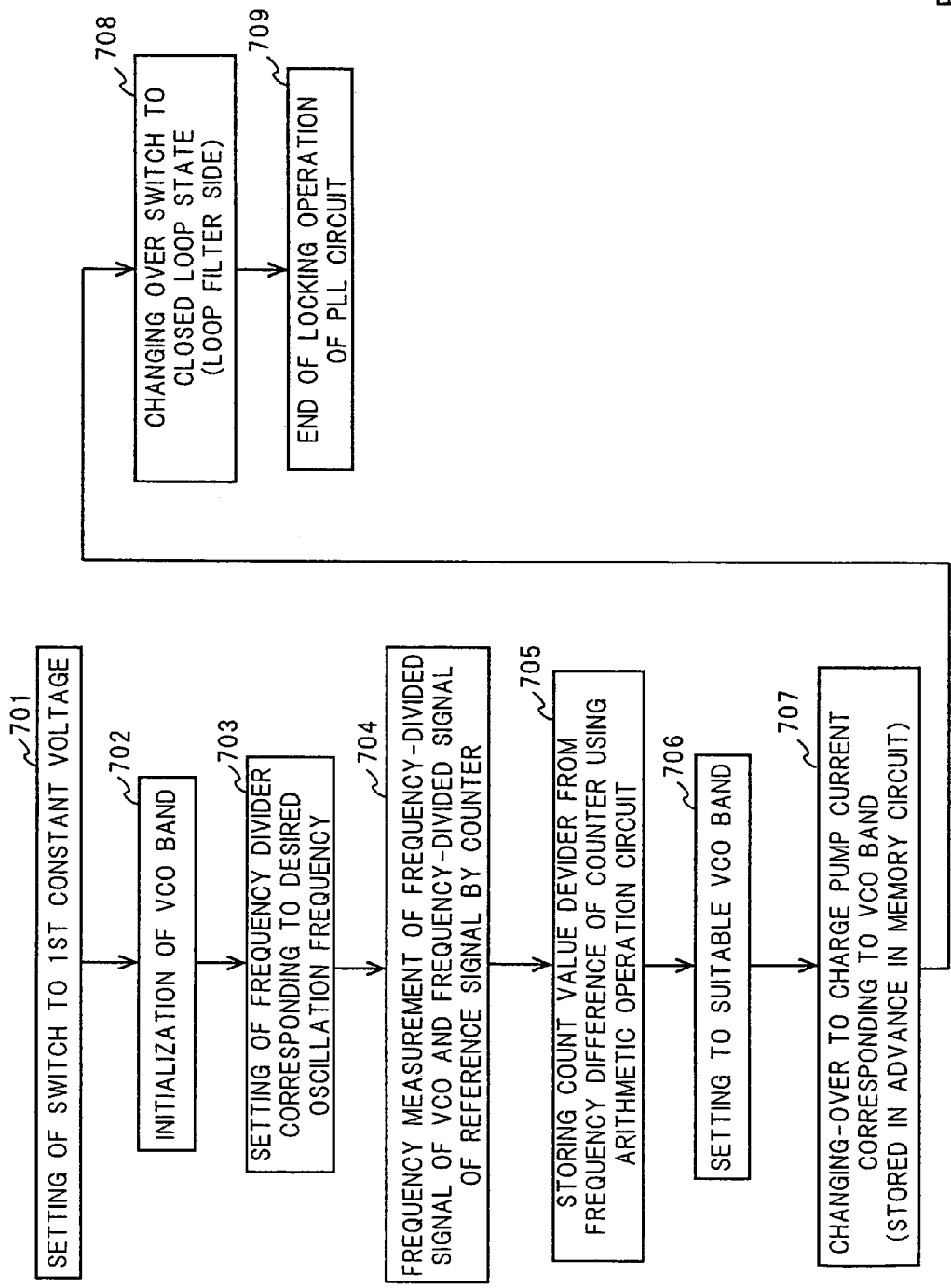
FIG. 7 is a flow chart of an oscillation frequency control method of the embodiment 1 of the present invention.

Next, the operation of switching the switch 8 is described using FIG. 7. FIG. 7 is a flow chart of the oscillation frequency control method of Embodiment 1 of the present invention.

First, the switch 8 sends the output voltage of the constant voltage source 9 to the voltage controlled oscillator 1 as the control voltage according to a switch change-over signal 16 sent to the switch 8 by the control unit 602. The PLL circuit turns to the open-loop state (Step 701). It is desirable to set the first constant voltage outputted by the constant voltage source 9 to the central value of the variable range of the frequency control voltage of the voltage controlled oscillator 1.

According to the control signal (not shown) that the control unit 602 sent to the VCO band selection circuit 14, the VCO band selection circuit 14 initializes the band of the voltage controlled oscillator 1 (Step 702). It is desirable to set the band of this initial setting to be the band of the frequency of the center of all the bands. The voltage controlled oscillator 1 oscillates in the selected band.

The control unit 602 sets N and R, which were determined according to the set frequency (the target oscillation frequency of the voltage controlled oscillator 1) on the frequency dividers 2 and 4, respectively (Step 703). When the oscillation frequency of the voltage controlled oscillator 1 agrees with the target oscillation frequency, the frequency fOSC/N of the output signal of the frequency divider 2 and the frequency fSTD/R of the output signal of the frequency divider 4 agree to each other.

The control unit 602 sends a control signal (not shown) to instruct the frequency counter 11 and the arithmetic operation circuit 12 to measure the frequency of the divided signal of the output signal of the voltage controlled oscillator 1. The frequency counter 11 inputs the divided signal of the reference signal and the divided signal of the output signal of the voltage controlled oscillator 1, and counts (step 704) the numbers of respective divided signals and outputs a first finite difference pulse and a second finite difference pulse which are proportional to the frequency difference between two divided signals.

The arithmetic operation circuit 12 inputs the first finite difference pulse and the second finite difference pulse which are outputted from the frequency counter 11. When inputting the signals, which are those signals obtainable by dividing the center frequencies of two adjacent VCO bands respectively by N, onto the frequency counter 11, the time duration of the first finite difference pulse or of the second finite difference pulse is counted with the clock having a period of reciprocal integer number times the time duration of the first finite difference pulse (or of the second finite difference pulse), then the counted value is stored in the memory circuit 13 (step 706).

The VCO band selection circuit 14 sets the voltage controlled oscillator 1 to the optimum band according to the count value of the time duration of the first finite difference pulse or the second finite difference pulse stored in the memory circuit 14 (Step 706).

The CP current selection circuit 15 sets the value of the current of the charge pump 6 (Step 707).

The control unit 602 sends the switch change-over signal 16 to the switch 8. According to the switch change-over signal 16, the switch 8 sends the output voltage of the loop filter 7 to the voltage controlled oscillator 1 as the control voltage. The PLL circuit becomes a closed-loop state (Step 708). The PLL circuit starts the ordinary closed-loop operation. The voltage controlled oscillator 1 oscillates at the target frequency in the set band (Step 709).

Figure 6:
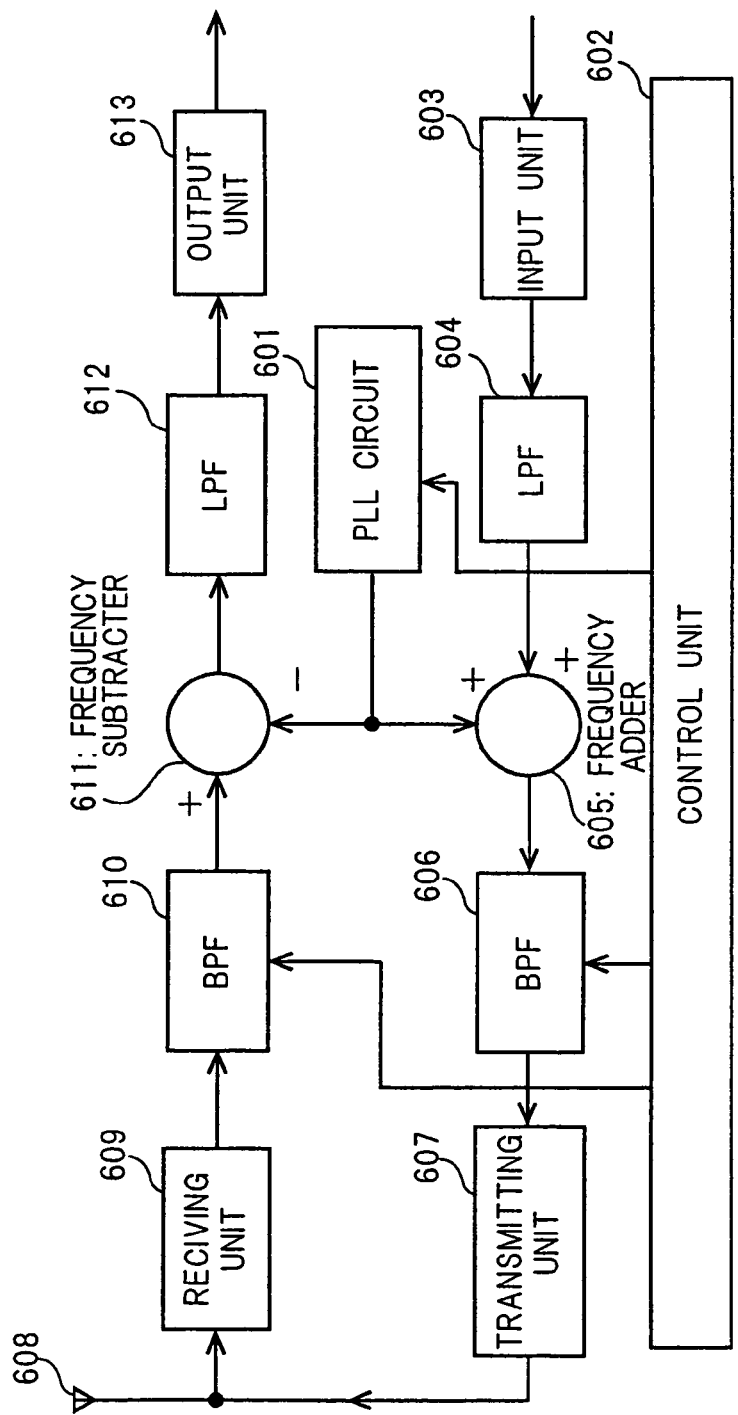
FIG. 6 is a block diagram showing the schematic configuration of a radio communication equipment of the embodiment 1 of the present invention.

FIG. 6 is a block diagram showing an outline configuration of a radio communication equipment of Embodiment 1 of the present invention. The radio communication equipment of Embodiment 1 is a mobile terminal of a mobile phone or a base station apparatus of a mobile phone. In FIG. 6, numeral 601 designates the above-mentioned PLL circuit, numeral 602 designates a control unit, numeral 603 designates a input unit, numeral 604 designates a low-pass filter (LPF), numeral 605 designates a frequency adder, numeral 606 designates a band-pass filter (BPF), numeral 607 designates a transmitting unit, numeral 608 designates a radio antenna, numeral 609 designates a receiving unit, numeral 610 designates a band-pass filter (BPF), numeral 611 designates a frequency subtracter, numeral 612 designates a low-pass filter (LPF), and numeral 613 designates an output unit.

The control unit 602 is a microcomputer and controls the whole operation of the ratio communication equipment. When changing the frequency of transmitting carrier wave used for the radio communication in the radio communication equipment, the control unit 602 changes the oscillation frequency of the PLL circuit 601 and changes the pass band of the BPF 606. When changing the frequency of receiving carrier wave used for the radio communication in the radio communication equipment, the control unit 602 changes the oscillation frequency of the PLL circuit 601 and changes the pass band of the BPF 610.

The operation of the transmitting system is described. The input unit 603 inputs the signal of the base band. The LPF 604 cuts the unnecessary high frequency range component of the input signal of the base band. The PLL circuit 601 outputs the signal of a specified frequency. The frequency adder 605 is the modulator which modulates an input signal. The frequency adder 605 produces a signal of a frequency resulted from the addition of the frequency of the input signal and the frequency of the output signal of the PLL circuit 601.

The BPF 606 lets only the component of a desired frequency range transmit from the output signal of the frequency adder 605. The transmitting unit 607 outputs the output signal of the BPF 606 through the radio antenna 608.

Next, the operation of the receiving system is described. The receiving unit 609 receives a radio signal through the radio antenna 608. The BPF 610 lets only the component of a desired frequency range transmit from the received radio signal of frequency adder 605. The PLL circuit 601 outputs a signal of specified frequency. The frequency subtracter 611 is a demodulator that demodulates the output signal of the BPF 610 into a base band signal. The frequency subtracter 611 subtracts the frequency of the output signal of the PLL circuit 601 from the frequency of the output signal of the BPF 610 and outputs the base band signal.

Embodiment 2

Figure 8:
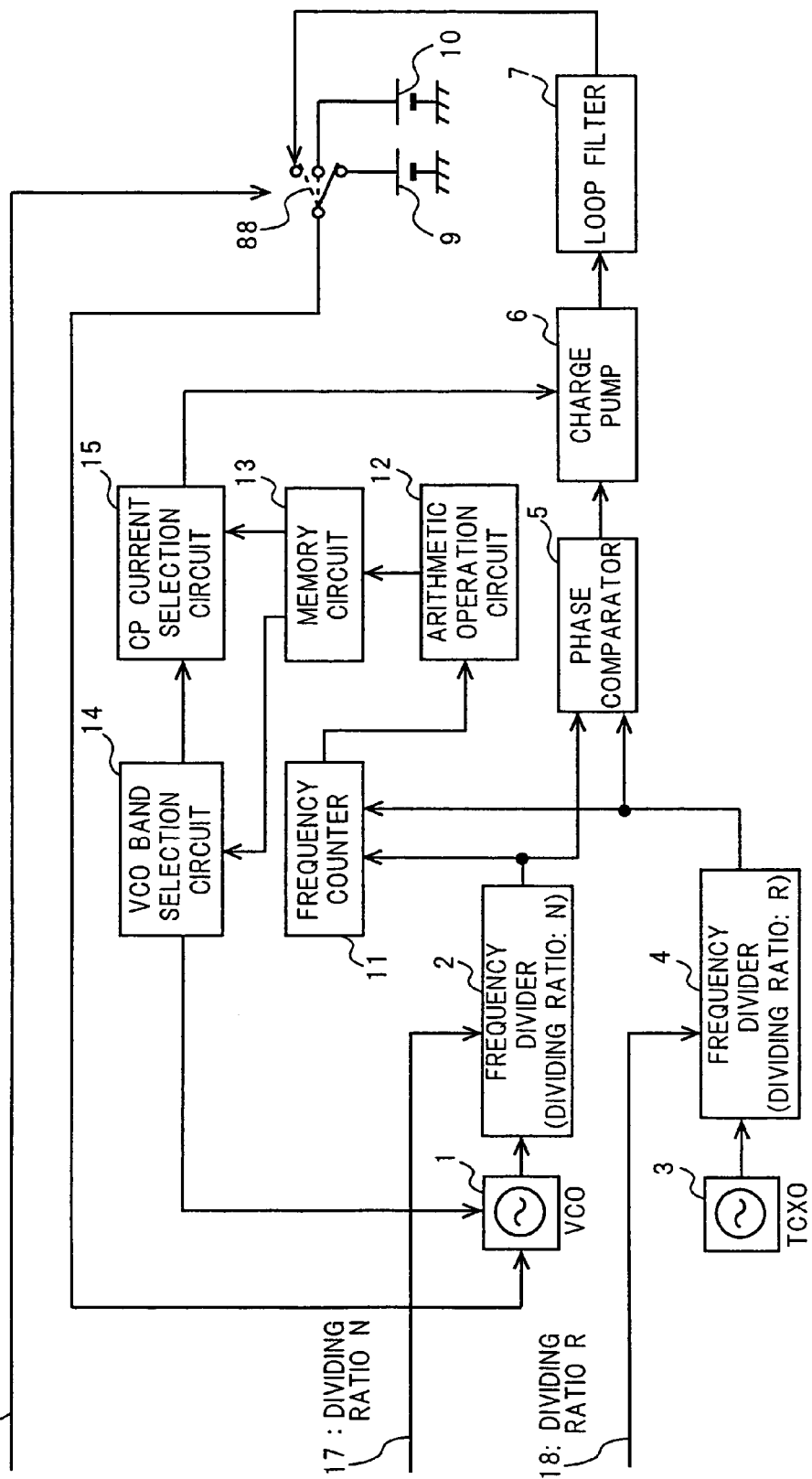
FIG. 8 is a block diagram showing the configuration of a PLL circuit of embodiments 2 and 3 of the present invention.
Figure 9:
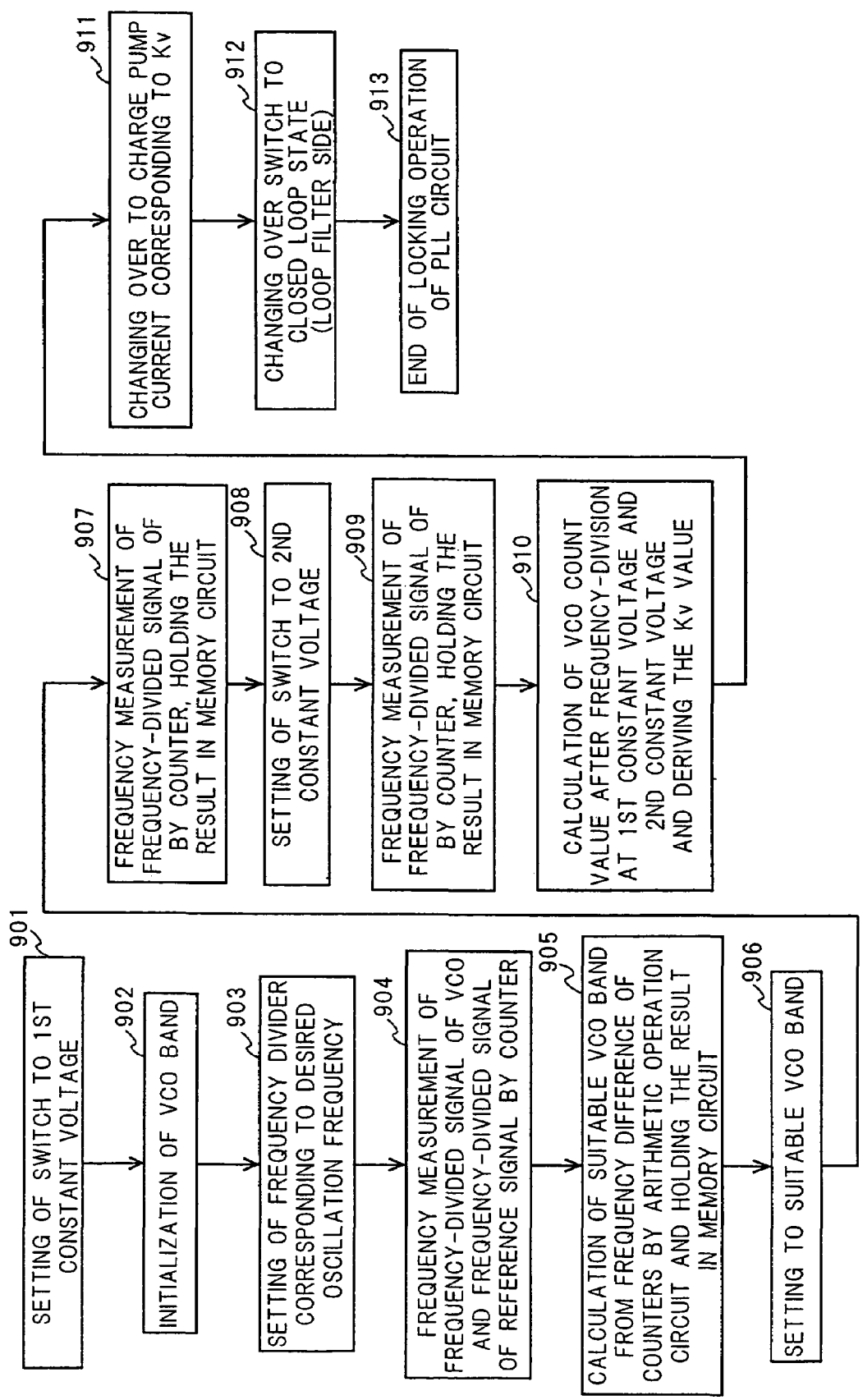
FIG. 9 is a flow chart of an oscillation frequency control method of the embodiment 2 of the present invention.

Using FIG. 8 and FIG. 9, a PLL circuit a radio communication equipment, and an oscillation frequency control method of Embodiment 2 of the present invention are described. FIG. 8 is a block diagram showing the configuration of the PLL circuit of Embodiment 2 of the present invention. The PLL circuit of Embodiment 2 differs from the PLL circuit of Embodiment 1 (FIG. 1) an those points that it has a 3-position change-over switch 88 in place of the 2-position change-over switch 8, and further has a second constant voltage source 10 for supplying a second constant voltage. On the other points, the PLL circuit of Embodiment 2 is identical with the PLL circuit of Embodiment 1. The constant voltage source 10 is integrated into a single IC chip together with semiconductor elements and others of the voltage controlled oscillator 1.

The radio communication equipment of Embodiment 2 of the present invention has the PLL circuit of Embodiment 2 in place of the PLL circuit of Embodiment 1. On the other points, the radio communication equipment of Embodiment 2 is identical with the radio communication equipment of Embodiment 1 (FIG. 6).

The operation of the PLL circuit in Embodiment 2 is described. The operation state that the switch 88 sends the control voltage outputted from the loop filter 7 to the voltage controlled oscillator 1 is identical with that in Embodiment 1.

Next, using FIG. 9, the operation of switching over the switch 88 is described. FIG. 9 is a flow chart of the oscillation frequency control method of Embodiment 2 of the present invention.

First, the switch 88 sends the output voltage (first constant voltage) of the constant voltage source 9 to the voltage controlled oscillator 1 as the control voltage according to the switch change-over signal 16 which was sent to the switch 88 by the control unit 602. The PLL circuit becomes an open loop state (Step 901). It is desirable to set the first constant voltage outputted by the constant voltage source 9 to the center value of the variable range of the frequency control voltage of the voltage controlled oscillator 1.

According to the control signal (not shown) that the control unit 602 sent to the VCO band election circuit 14, the VCO band selection circuit 14 initializes the band of the voltage controlled oscillator 1 (Step 902). It is desirable to select the band of the initial setting to be the band of the frequency of the center of all bands. The voltage controlled oscillator 1 oscillates in the selected band.

The control unit 602 sets N and R which were determined according to the setting frequency (the target oscillation frequency of the voltage controlled oscillator 1) to the frequency dividers 2 and 4, respectively (Step 903). When the oscillation the frequency of the voltage controlled oscillator 1 coincides with the target oscillation frequency, frequency fOSC/N of the output signal of the frequency divider 2 and the frequency fSTD/R of the output signal of the frequency divider 4 matches to each other.

The control unit 602 sends a control signal (not shown) and instructs the frequency counter 11 and the arithmetic operation circuit 12 to measure the frequency of the frequency divided signal of the output signal of the voltage controlled oscillator 1. The frequency counter 11 inputs the frequency-divided signal of the reference signal and the frequency divided signal of the output signal of the voltage controlled oscillator 1, and counts (Step 904) the number of the respective frequency divided signals and outputs a first finite difference pulse and a second finite difference pulse which are proportional to the frequency difference between the two frequency-divided signals.

The arithmetic operation circuit 12 inputs the first finite difference pulse and the second finite difference pulse, and when inputting the signals, of is which the center frequencies of two adjacent VCO bands are respectively divided by N, to the frequency counter 11, it counts the time duration of the first finite difference pulse or of the second finite difference pulse with the clock having a period of reciprocal integer number times the time duration of the first finite difference pulse (or of the second finite difference pulse) outputted by the frequency counter 11, and then stores it in the memory circuit 13 (Step 905).

The VCO band selection circuit 14 sets the voltage controlled oscillator 1 to the best-fit band according to the count value of the time duration of the first finite difference pulse or of the second finite difference pulse stored in the memory circuit 14 (Step 906).

Under this condition, the frequency counter 11 and the arithmetic operation circuit 12 measure again the frequency fOSC/N of the output signal of the frequency divider 2. The first constant voltage outputted by the constant voltage source 9 is set to the center value of the variable range of the frequency control voltage of the voltage controlled oscillator 1.

The arithmetic operation circuit 12 inputs the first finite difference pulse and the second finite difference pulse outputted by the frequency counter 11. When inputting the signals, which are those signals obtainable by frequency dividing the center frequencies of two adjacent VCO bands respectively by N, to the frequency counter 11, the time duration of the first finite difference pulse or of the second finite difference pulse is counted with the clock having a period of reciprocal integer number times the time duration of the first finite difference pulse (or of the second finite difference pulse) outputted by the frequency counter 11, and then the counted value is stored in the memory circuit 13 (step 907).

Next, the control unit 602 sends the switch change-over signal 16 to the switch 88 and the switch 88 sends the output voltage of the constant voltage source 10 to the voltage controlled oscillator 1 as the control voltage. The PLL circuit maintains the open-loop state (Step 908). The second constant voltage outputted by the constant voltage source 10 has a value deviating by a specified voltage from the first constant voltage (the center value of the variable range of the frequency control voltage of the voltage controlled oscillator 1).

Under this condition, the frequency counter 11 and the arithmetic operation circuit 12 measure once again the frequency fOSC/N of the output signal of the frequency divider 2.

The arithmetic operation circuit 12 inputs the first finite difference pulse and the second finite difference pulse outputted by the frequency counter 11. When inputting the signals, which are those signals obtainable by dividing the center frequencies of two adjacent VCO bands respectively by N, to the frequency counter 11, the time duration of the first finite difference pulse or of the second finite difference pulse is counted with the clock having a period of reciprocal integer number times the time duration of the first finite difference pulse (or of the second finite difference pulse) outputted by the frequency counter 11, and then the counted value is stored in the memory circuit 13 (Step 909).

The CP current selection circuit 15 calculates Kv of the voltage controlled oscillator 1 in the relevant band from a value of the finite difference between the count value of the time duration of the first finite difference pulse or of the second finite difference pulse in the first constant voltage and the count value of the time duration of the first finite difference pulse or of the second finite difference pulse in the second constant voltage (Step 910).

The CP current selection circuit 15 sets the current value of the charge pump 6 suited to Kv of the voltage controlled oscillator 1 in the relevant band (Step 911). Specifically, for the measured Kv, the current value of the charge pump 6 is set so that the value of (Kv×charge pump current) becomes a constant optimum value for any band.

The control unit 602 sends the switch change-over signal 16 to the switch 88. According to the switch change-over signal 16, the switch 88 sends the output voltage of the loop filter 7 to the voltage controlled oscillator 1 as the control voltage. The PLL circuit turns to the closed-loop state (Step 912). The PLL circuit starts the ordinary closed-loop operation. The voltage controlled oscillator 1 oscillates at the target frequency in the set band (Step 913).

In the PLL circuit of Embodiment 2, the band of the voltage controlled oscillator 1 is determined, and at the same time, Kv is measured by changing the frequency control voltage of the constant voltage that is applied to the voltage controlled oscillator 1. Responding to the change in Kv, the input/output current of the constant current type charge pump 6 is changed. As a result, the loop-gain of the PLL circuit can be kept constant and a possible variation in the PLL circuit characteristic can be avoided. Even if the values of those elements such as inductors 206 and 207, varactor diodes 204 and 205, and capacitors of fixed capacitance 210 to 213 have a certain amount of distribution or even if they fluctuates due to their temperature characteristics, optimum compensation always becomes possible.

Embodiment 3

Figure 10:
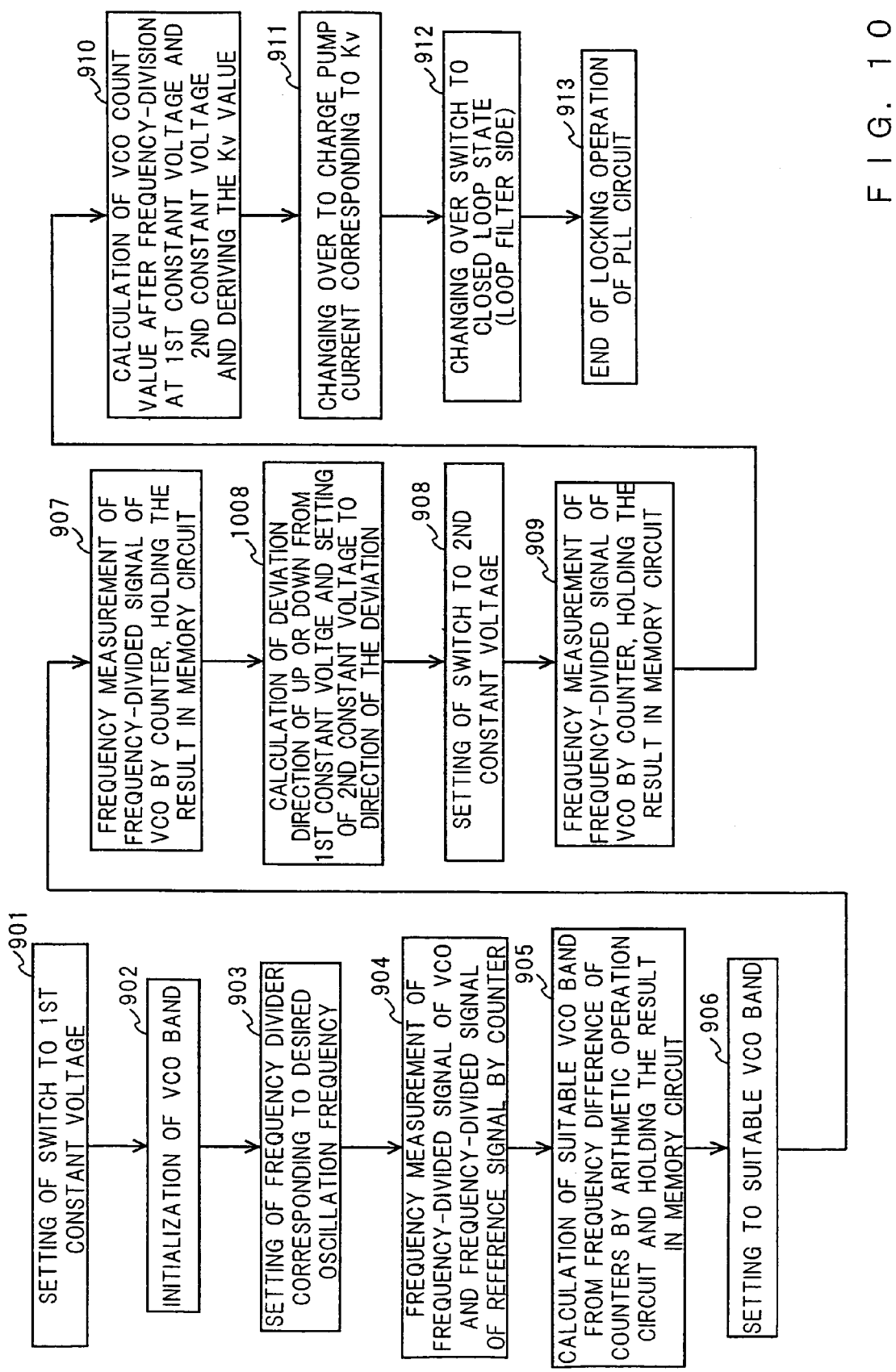
FIG. 10 is a flow chart of an oscillation frequency control method of the embodiment 3 of the present invention.

Using FIG. 10, a PLL circuit, a radio communication equipment, and an oscillation frequency control method of Embodiment 3 of the present invention are described. The configurations of the PLL circuit and the radio communication equipment of Embodiment 3 of the present invention are the same as those of the PLL circuit (FIG. 8) and of the radio communication equipment (FIG. 6) of Embodiment 2.

In Embodiment 3, however, the constant voltage source 10 can output in a selectable way a second constant voltage which is higher by a specified voltage than the first constant voltage outputted by the constant voltage source 9 and a second constant voltage which is lower by a specified voltage than the first constant voltage. On the other points, they are identical.

The oscillation frequency control method of the PLL circuit of the embodiment 3 that is done by switching over the switch 88 is described. FIG. 10 is a flow chart of the oscillation frequency control method of the embodiment 3 of the present invention.

In the oscillation frequency control method (FIG. 10) of Embodiment 3, a step 1008 is prepared between the step 907 and the step 908 of the oscillation frequency control method (FIG. 9) of embodiment 2.

In the other points, the oscillation frequency control method (FIG. 10) of Embodiment 3 is identical with the oscillation frequency control method (FIG. 9) of Embodiment 2.

In FIG. 10, at the step 906, the voltage controlled oscillator 1 is set to an optimum band. Under this condition, the frequency counter 11 and the arithmetic operation circuit 12 measure again the frequency fOSC/N of the output signal of the frequency divider 2. The first constant voltage that the constant voltage source 9 outputs is set to the center value of the variable range of the frequency control voltage of the voltage controlled oscillator 1.

The arithmetic operation circuit 12 inputs the first finite difference pulse and the second finite difference pulse that the frequency counter 11 outputs.

When inputting the signals which are those signals are obtained by dividing the center frequencies of two adjacent VCO bands respectively by N to the frequency counter 11, the time duration of the first finite difference pulse or of the second finite difference pulse is counted with the clock having a cycle of an integer fraction of the time duration of the first finite difference pulse (or of the second finite difference pulse), then the counted value is stored in the memory circuit. 13 (step 907).

At the step 907 the control unit 602 transmits the switch change-over signal 16 to the switch 88, and the switch 88 transmits the output voltage of the loop filter 7 to the voltage controlled oscillator 1 as the control voltage. The PLL circuit turns to the closed-loop state.

Under this condition, the frequency counter 11 and the arithmetic operation circuit 12 measure the frequency fOSC/N of the output signal of the frequency divider 2 once again.

The arithmetic operation circuit 12 inputs the first finite difference pulse and the second finite difference pulse that the frequency counter 11 outputs.

When inputting the signals which are those signals are obtained by dividing the center frequencies of two adjacent VCO bands respectively by N, to the frequency counter 11, the time duration of the first finite difference pulse or of the second finite difference pulse is counted with the clock having a cycle of an integer fraction of the time duration of the first finite difference pulse (or of the second finite difference pulse), then the count value is stored in the memory circuit 13. The control unit 602 judges to which side of the first constant voltage the oscillation frequency in the closed state deviates.

If the oscillation frequency in the closed-loop state is higher than the first constant voltage, the constant voltage source 10 outputs the second constant voltage which is higher by a specified voltage than the first constant voltage that the first voltage source 9 outputs.

If the oscillation frequency in the closed-loop state is lower than the first constant voltage, the constant voltage source 10 outputs the second constant voltage which is lower by a specified voltage than the first constant voltage that the first voltage source 9 outputs (Step 1008).

The control unit 602 transmits the switch change-over signal 16 to the switch 88, the switch 88 transmits the output voltage of the constant voltage source 10 to the voltage controlled oscillator 1 as a control voltage. The PLL circuit turns to the open loop state (Step 908). Hereinafter, Kv of the voltage controlled oscillator 1 at the band is calculated in a similar manner as in the embodiment 2 and sets a current value of the charge pump 6 which is suited to Kv is set (Steps 909 to 911).

The control unit 602 transmits the switch change-over signal 16 to the switch 88. According to the switch change-over signal 16, the switch 88 transmits the output voltage of the loop filter 7 to the voltage controlled oscillator 1 as a control voltage. The PLL circuit turns to the closed-loop state (Step 912). The PLL circuit starts the normal closed-loop operation. The voltage controlled oscillator 1 oscillates at the target frequency in the set band (Step 913).

Even in the case that Kv varies according to the frequency-control voltage in a same band, Kv in the vicinity of the frequency-control voltage which is close to the actual locking operation point can be measured by the method of the embodiment 3, thereby the accuracy of the compensation can be improved.

In the embodiment 3, the constant voltage source 10 can selectively output the second constant voltage which is higher by a specified voltage than the first constant voltage and the second constant voltage which is lower by a specified voltage than the first constant voltage. Alternatively, it may be configured as such that with using a four-point selection switch as the switch 8, the constant voltage source 9 can selectively output via the switch 8, a second constant voltage which is higher by a specified voltage than the first constant voltage, and a third constant voltage which is lower by a specified voltage than the first voltage.

Embodiment 4

Figure 11:
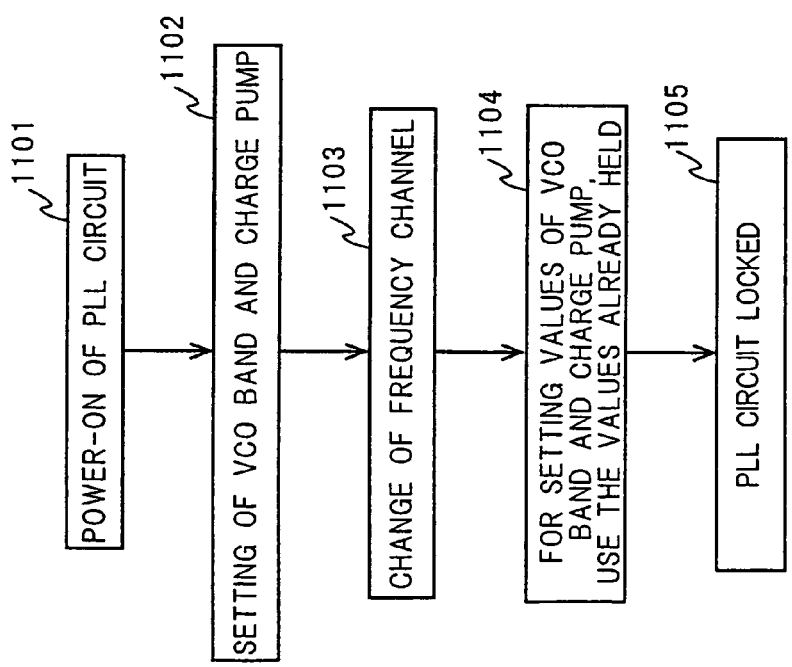
FIG. 11 is a flow chart of an oscillation frequency control method of the embodiment 4 of the present invention.

Using FIG. 11, a PLL circuit, a radio communication equipment and an oscillation frequency control method of Embodiment 4 of the present invention are described. The configuration of the PLL circuit, and the radio communication equipment of the embodiment 4 have the configuration that is identical with the PLL circuit (FIG. 8), the radio communication equipment (FIG. 6) of Embodiment 3.

The oscillation frequency control method of the PLL circuit of Embodiment 4 is described. As for the PLL circuit of Embodiment 4, the variable range of the oscillation frequency is extremely narrow. FIG. 11 is a flow chart of the oscillation frequency control method of the embodiment 4 of the present invention.

In FIG. 11, first, the PLL circuit is turned on (Step 1101). In a manner shown in FIG. 10, the band of the voltage controlled oscillator 1 and the input/output current of charge pump 6 are set (Step 1102). In the initial setting, setting is done so that the voltage controlled oscillator 1 oscillates at the operating frequency of the center of the operating frequency band.

The radio communication equipment of the embodiment 4 which is a mobile terminal (or a base station equipment) of mobile phone system changes the frequency channels. The target oscillation frequency of the PLL circuit is changed (Step 1103).

However, because the width of the frequency variation is very narrow, the voltage controlled oscillator 1 oscillates in the band which was set at the time when the power was turned on, and the charge pump 6 inputs and outputs the current under the setting done at the time when the power was turned on (Step 1104). The PLL circuit is locked. The voltage controlled oscillator 1 oscillates at the target frequency in the set band (Step 1105).

In the embodiment 4, the PLL circuit and the radio communication equipment of the embodiment 3 were described. It is also possible to apply the oscillation frequency control method of the embodiment 4 to the PLL circuit and the radio communication equipment of the embodiment 1 or 2.

Embodiment 5

Figure 12:
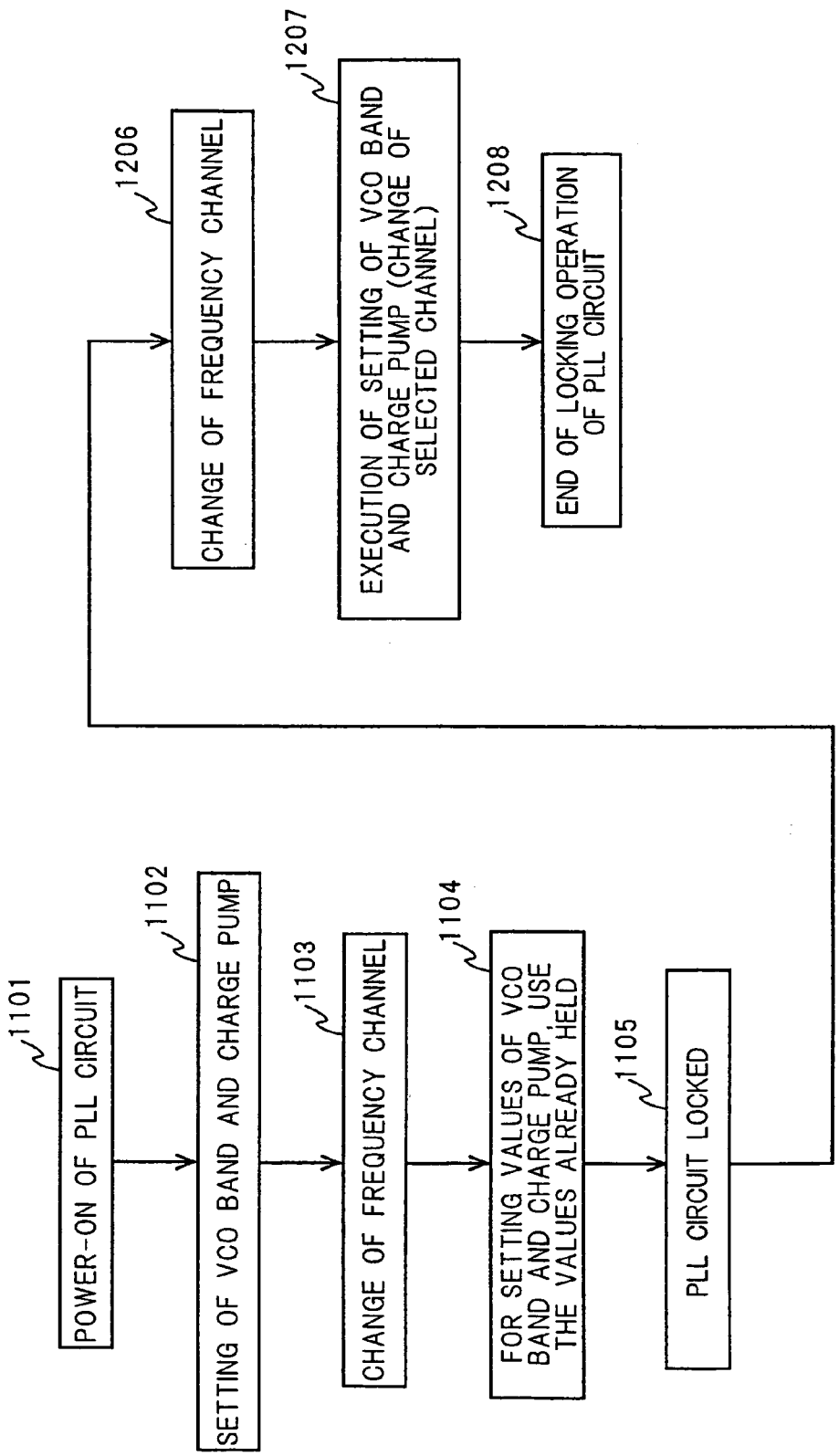
FIG. 12 is a flow chart of an oscillation frequency control method of the embodiment 5 of the present invention.

Using FIG. 12, the PLL circuit, a radio communication equipment, and an oscillation frequency control method of the embodiment 5 of the present invention are described. The configuration of the PLL circuit and the radio communication equipment of Embodiment 5 of the present invention has the identical configuration with that of the PLL circuit (FIG. 8), the radio communication equipment (FIG. 6) of Embodiment 3.

The oscillation frequency control method of the PLL circuit of Embodiment 5 is described. The radio communication equipment of Embodiment 5 permits the control unit 602 to execute the band selection operation and the setting-operation of the gain of the charge pump 6 during the waiting time for a radio communication signal (time of no radio communication), thereby the band selection operation and the charge pump current selection operation which are described in Embodiment 3 are executed.

During the time of transmitting/receiving of the radio communication signal, the control unit 602 prohibits the band selection operation and the setting-operation of the gain of the charge pump 6, thereby these operations are not executed.

Even during the time of no radio communication, when the changed radio communication frequency channel deviates equal to or more than a specified channel number from the original radio communication frequency channel, the PLL circuit executes the band selection and the setting-operation of the charge pump current, and when the deviation is less than the specified channel number, the selection operation is not executed.

The PLL circuit of Embodiment 5 has a function to change the control method of the band selection operation and the charge pump current selection operation according to the selection control signal which is sent from the control unit 602.

FIG. 12 is a flow chart of the oscillation frequency control method of Embodiment 5 of the present invention. In FIG. 12, the first steps 1101 to 1105 are identical with those of Embodiment 4 (FIG. 11). At the step 1103, it is assumed that the amount of deviation between the changed radio communication frequency channel and the original radio communication frequency channel was less than a specified channel number.

In FIG. 12, only steps 1206 to 1208 are different from Embodiment 4 (FIG. 11). The steps 1206 to 1208 are described.

The radio communication equipment of Embodiment 5, which is a mobile terminal (or a base station equipment) of the mobile phone system, changes the frequency channels. The target oscillation frequency of the PLL circuit is changed (Step 1206). It is assumed that the changed radio communication frequency channel deviates more than a specified channel number from the original radio communication frequency channel.

According to the selection control signal sent from the control unit 602, the PLL circuit executes either one of the oscillation frequency control methods of Embodiments 1 to 3, thereby the band setting of the voltage controlled oscillator 1 and the current setting of the charge pump 6 (Step 1207) are done. By the new setting, the PLL circuit locks (Step 1208).

In Embodiment 5, the PLL circuit of Embodiment 3 and the radio communication equipment are described. It is also possible to apply the oscillation frequency control method of Embodiment 5 to the PLL circuit and the communication equipment of the embodiment 1 or 2.

Embodiment 6

Figure 13:
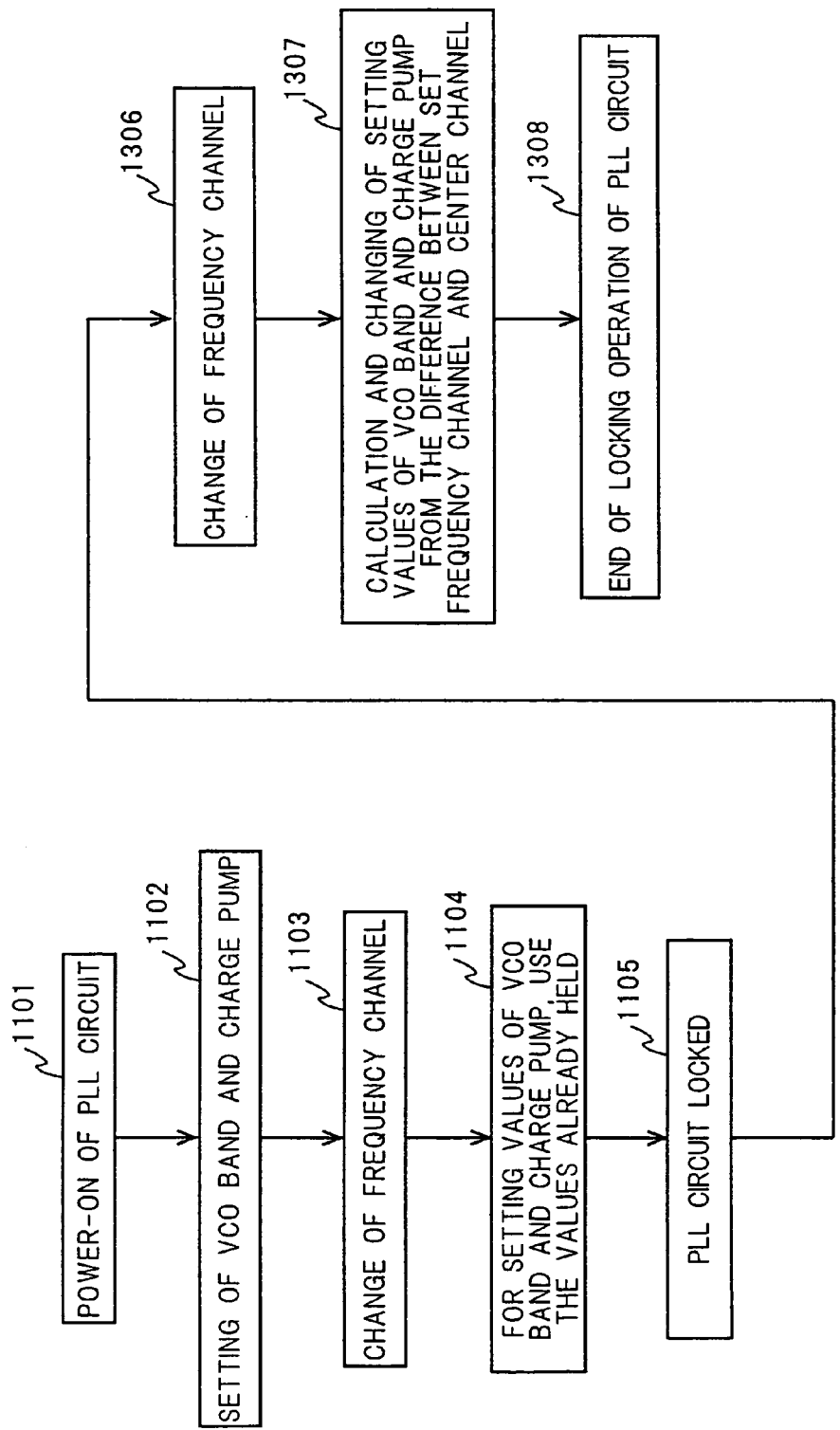
FIG. 13 is a flow chart of an oscillation frequency control method of the embodiment 6 of the present invention.
Figure 14:
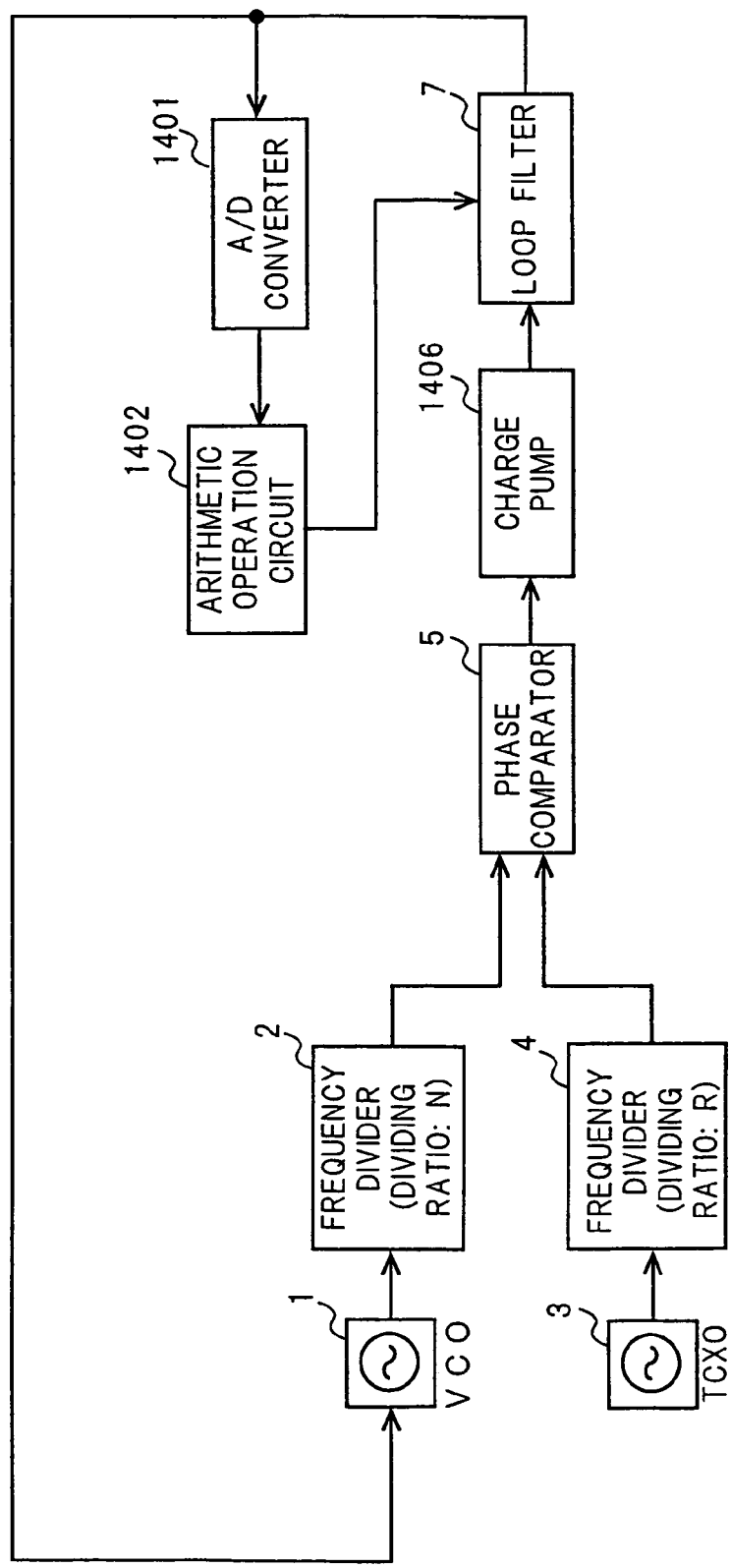
FIG. 14 is the PLL circuit 1 of a conventional invention.
Figure 15:
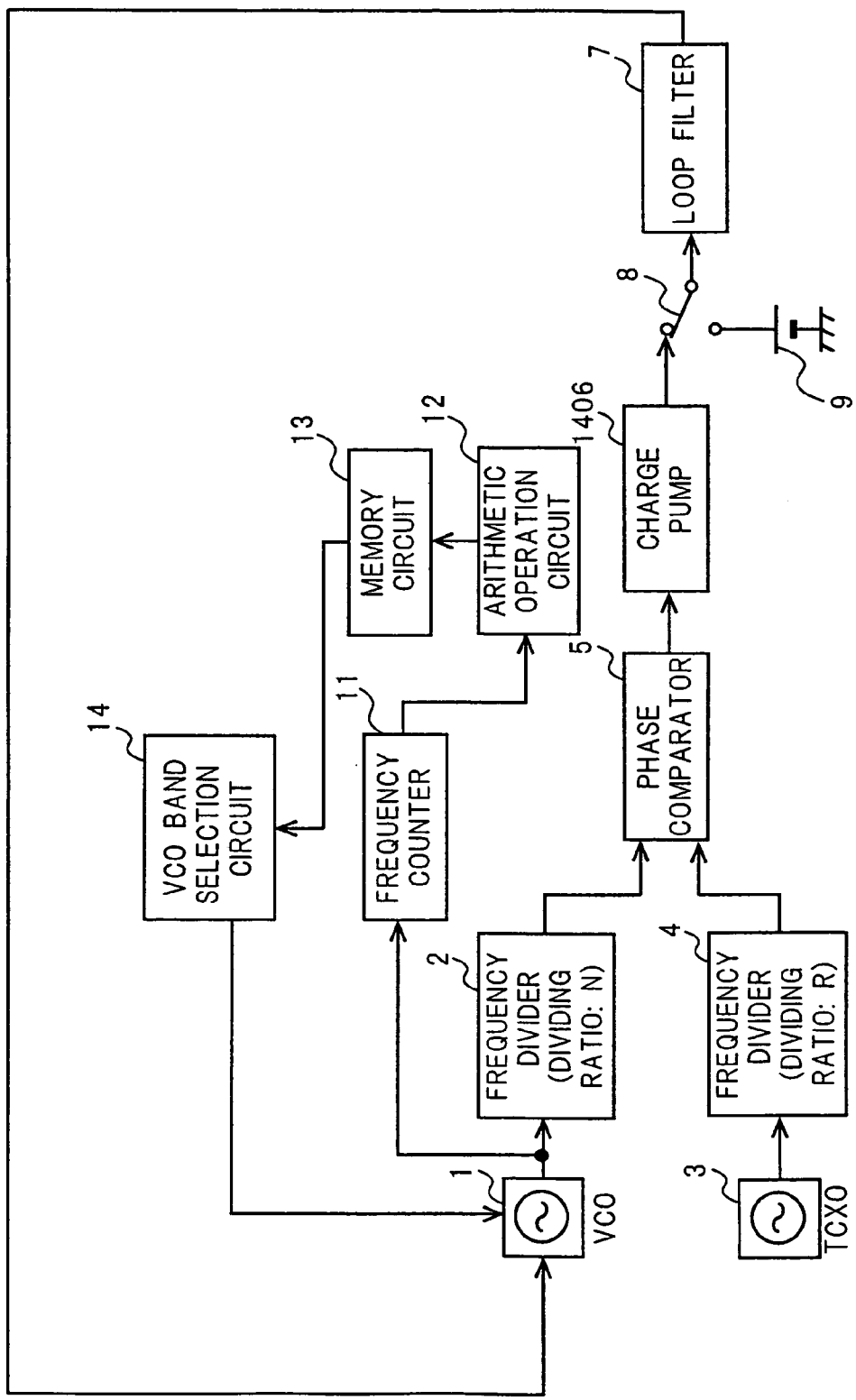
FIG. 15 is the PLL circuit 2 of a conventional invention.

Using FIG. 13, a PLL circuit, a radio communication equipment, and an oscillation frequency control method of Embodiment 6 of the present invention are described. The configuration of the PLL circuit and the radio communication equipment of Embodiment 6 of the present invention has a configuration that is identical with that of the PLL circuit (FIG. 8) and the radio communication equipment (FIG. 6) of Embodiment 3.

The oscillation frequency control method of the PLL circuit of Embodiment 6 is described. The radio communication equipment of Embodiment 6 permits the control unit 602 to execute the band selection operation and the setting-operation of the gain of the charge pump 6 during the waiting time of a radio communication signal (time of no radio communication), thereby the band selection operation and the charge pump current selection operation which are described in Embodiment 3 are executed.

During the time of the transmitting/receiving of the radio communication signal, the control unit 602 prohibits the band selection operation and the setting-operation of the gain of the charge pump 6, thereby these operations are not executed.

Also, during the time of no radio communication, when the changed radio communication frequency channel deviates equal to or more than a specified channel number from the original radio communication frequency channel, the PLL circuit executes the band selection and the setting-operation of the charge pump current, and when the deviation is less than the specified channel number, the selection operation is not executed.

The PLL circuit of Embodiment 6 has a function to change the control method of the band selection operation and the charge pump current selection operation according to the selection control signal which was transmitted from the control unit 602.

The PLL circuit of Embodiment 6 has a broad-band oscillation frequency control range, and when, for example, a frequency control over a plural number of bands is necessary, a quick lock-up time is required. In such the case, there is no time to repeat the selection of the band and the charge pump current by the method of Embodiment 3.

FIG. 13 is a flow chart of the oscillation frequency control method of Embodiment 6 of the present invention. In FIG. 13, the first steps 1101 to 1105 are identical with those of Embodiment 4 (FIG. 11). At the step 1103, it is assumed that the amount of deviation between the changed radio communication frequency channel and the original radio communication frequency channel is less than a specified channel number.

In FIG. 13, only steps 1306 to 1308 are different from those of Embodiment 4 (FIG. 11). Steps 1306 to 1308 are described.

The radio communication equipment of Embodiment 6, which is a mobile terminal (or the base station equipment) of the mobile phone system, changes the frequency channels. The target oscillation frequency of the PLL circuit is changed (Step 1306). It is assumed that the changed radio communication frequency channel deviates more than a specified channel number from the original radio communication frequency channel. However, a quick lock-up time is required, there is no time to repeat the selection of the band and the charge pump current by the method of Embodiment 3.

The memory circuit 13 of Embodiment 6 stores information of correspondence between the respective radio communication frequencies of the PLL circuit and respective band frequencies thereof together with the optimum charge pump current values in respective bands as a specified table.

When a new target frequency is set, receiving an instruction from the control unit 602, the VCO band selection circuit 14 and the CP current selection circuit 15 execute the band setting of the voltage controlled oscillator 1 and the setting of the gain of the charge pump 6 based on the new target frequency or based on the finite difference between the new target frequency and the above-mentioned specified target frequency using the table stored in the memory circuit 13 (Step 1307).

By the new setting, the PLL circuit locks (Step 1308).

In the case of composing the VCO band current selection circuit 14 and the CP current selection circuit 15 with a microcomputer, it is also possible to have a specified computation equation for deriving the information of correspondence between the respective radio communication frequencies of the PLL circuit and respective band frequencies thereof together with the optimum charge pump current values.

In case that a quick lock-up is required, the PLL circuit executes the oscillation frequency control method of the step 1307 of Embodiment 6, and in case that an accurate setting is executed even with taking time to an certain extent, it is also possible that the PLL circuit executes the oscillation frequency control method of the step 1207 of Embodiment 5.

When executing the oscillation frequency control method of the step 1207, the data stored in the memory circuit 13 is updated. Thus, the setting accuracy of the oscillation frequency control method of the step 1307 using the data stored in the memory circuit 13 can be improved.

In Embodiment 6, the PLL circuit of and the radio communication equipment Embodiment 3 are described. The oscillation frequency control method of Embodiment 6 can also be applied to the PLL circuit and the radio communication equipment of Embodiment 1 or 2.

In Embodiments 1 to 6, in the case when changing over the connection of the switch 8, the state in which the oscillation frequency of the voltage controlled oscillator 1 is measured by applying the first or the second constant voltage as a control voltage is changed to the state in which the voltage controlled oscillator 1 is made oscillate by applying the output voltage of the loop filter 7 as a control voltage, the gain of the charge pump 6 is set high in a transitionally short time. Then, after a specified time or after the oscillation frequency of the voltage controlled oscillator 1 locks in a specified finite difference range with respect to the target oscillation frequency, to set the gain of the charge pump 6 is set to an appropriate value which is suitable to a selected band. By increasing the charge pump current transitionally, the lock-up time of the PLL circuit can be shortened when the open loop turns to the closed loop.

It is also possible to make the current value which was amplified transitionally to be a value that is proportional to the optimum charge pump current value for the band selected. For example, the transitionally amplified current value is made to be a current value resulted from the multiplication of a constant factor larger than one on the optimum charge pump current value for the band selected. The lock-up operation can be performed stably without receiving the influence of Kv.

Although the present invention has been described with respect to its preferred embodiments in sine detail, the disclosed contents of the preferred embodiments may change in the details of the structure thereof, and any change in the combination and sequence of the components may be attained without departing from the spirit and scope of the claimed invention.

INDUSTRIAL APPLICABILITY

The PLL circuit in accordance with the present invention can control the voltage controlled oscillator having a plural number of bands stably, and is useful as the circuits of such as the communication module and the communication equipment including mobile terminals, etc. The oscillation frequency control method of the present invention is useful as the control method of the PLL circuit of the radio communication equipment, etc. The radio communication equipment of the present invention is useful as the radio communication equipment such as a mobile telephone.

The invention claimed is:

1. An oscillation frequency control method comprising:
   an oscillation step of making a voltage controlled oscillator (VCO) have a plural number of bands oscillate in a selected band, the VCO having an oscillation frequency, the VCO having an output signal, the output signal of the VCO having the oscillation frequency,
   a first frequency-dividing step to divide the frequency of the output signal of said voltage controlled oscillator,
   a second frequency-dividing step to divide the frequency of a reference signal,
   a phase comparing step of detecting a phase difference between the frequency-divided signal in said first frequency-dividing step and the frequency-divided signal in said second frequency-dividing step and of outputting a phase difference signal,
   a current driving step for inputting and outputting a current generated at a gain which was set depending on the selected band based on said phase difference signal,
   a control voltage generation step for generating and outputting a control voltage of said voltage controlled oscillator by increasing or decreasing the control voltage with a specified low-pass filter characteristic by the current inputted and outputted at said current driving step,
   a second frequency measurement step for measuring the oscillation frequency of said voltage controlled oscillator by applying a first constant voltage as said control voltage in the selected band,
   a fourth frequency measurement step for measuring the oscillation frequency of said voltage controlled oscillator by applying the output voltage of said control voltage generation step in the selected band,
   a fifth frequency measurement step in which, in the selected band, when the frequency measured in the fourth frequency measurement step is higher than the frequency measured in the second frequency measurement step, a constant voltage higher by an amount of a specified voltage than said first constant voltage is selected, while when the frequency measured in the fourth frequency measurement step is lower than the frequency measured in the second frequency measurement step, a constant voltage lower by a specified voltage than said first constant voltage is selected, and then the selected constant voltage is applied as said control voltage, thereby the oscillation frequency of said voltage controlled oscillator is measured,
   a gain setting step to set the gain at said current driving step in the band, based on a frequency difference between the measured oscillation frequency in said second frequency measurement step and the measured oscillation frequency in said fifth frequency measurement step, and
   a step to make said voltage controlled oscillator oscillate by inputting and outputting the current generated at the gain that was set based on said phase difference signal in said current driving step, and then by applying the output voltage of said control voltage generation step as said control voltage.

2. The oscillation frequency control method of claim 1, further comprising:
   a step to prohibit or permit the band selection action and the gain setting action in said current driving step, and wherein, only when the band selection action and the gain setting action in said current driving step are permitted, the oscillation frequency control method is executed.

3. The oscillation frequency control method of claim 1, further comprising:
   a step to read and set the gain of said current driving step corresponding to the selected band from a memory storing the gain of said current driving step for respective bands.

4. The oscillation frequency control method of claim 1, wherein when switching over from the step for measuring the oscillation frequency of said voltage controlled oscillator by applying a constant voltage as said control voltage to the step for making said voltage controlled oscillator oscillate by applying the output voltage of said control voltage generation step as said control voltage, the gain of said current driving step is transiently set high, and after a specified time lapse or after the oscillation frequency of said voltage controlled oscillator is locked in a certain specified range of error with respect to a target frequency, the gain of said current driving step is set to a value corresponding to said selected band.

5. An oscillation frequency control method comprising:
an oscillation step of making a voltage controlled oscillator (VCO) have a plural number of bands oscillate in a selected band, the VCO having an oscillation frequency, the VCO having an output signal, the output signal of the VCO having the oscillation frequency,
a first frequency-dividing step to divide the frequency of the output signal of said voltage controlled oscillator,
a second frequency-dividing step to divide the frequency of a reference signal,
a phase comparing step of detecting a phase difference between the frequency-divided signal in said first frequency-dividing step and the frequency-divided signal in said second frequency-dividing step and of outputting a phase difference signal,
a current driving step for inputting and outputting a current generated at a gain which was set depending on the selected band based on said phase difference signal,
a control voltage generation step for generating and outputting a control voltage of said voltage controlled oscillator by increasing or decreasing the control voltage with a specified low-pass filter characteristic by the current inputted and outputted at said current driving step,
a step for executing said oscillation step, said first frequency-dividing step, said second frequency-dividing step, said phase comparing step, said current driving step, and said control voltage generation step, so that said voltage controlled oscillator oscillates at a specified target frequency at a time when a power source is turned on,
a step in which, in case that a new target frequency is set, based on the new target frequency, or based on a difference between the new target frequency and said specified target frequency, the band selection and the gain setting in said current driving step are executed using a specified arithmetic expression or a specified table,
a second frequency measurement step for measuring the oscillation frequency of said voltage controlled oscillator by applying a first constant voltage as said control voltage in the selected band,
a fourth frequency measurement step for measuring the oscillation frequency of said voltage controlled oscillator by applying the output voltage of said control voltage generation step in the selected band,
a fifth frequency measurement step in which, in the selected band, when the frequency measured in the fourth frequency measurement step is higher than the frequency measured in the second frequency measurement step, a constant voltage higher by an amount of a specified voltage than said first constant voltage is selected, while when the frequency measured in the fourth frequency measurement step is lower than the frequency measured in the second frequency measurement step, a constant voltage, lower by a specified voltage than said first constant voltage is selected, and then the selected constant voltage is applied as said control voltage, thereby the oscillation frequency of said voltage controlled oscillator is measured,
a gain setting step to set the gain at said current driving step in the band, based on the frequency difference between the measured oscillation frequency in said second frequency measurement step and the measured oscillation frequency in said fifth frequency measurement step, and a step to make said voltage controlled oscillator oscillate by inputting and outputting the current generated at the gain that was set based on said phase difference signal in said current driving step, and then by applying the output voltage of said control voltage generation step as said control voltage.

6. An oscillation frequency control method comprising:
an oscillation step of making a voltage controlled oscillator (VCO) have a plural number of bands oscillate in a selected band, the VCO having an oscillation frequency, the VCO having an output signal, the output signal of the VCO having the oscillation frequency,
a first frequency-dividing step to divide the frequency of the output signal of said voltage controlled oscillator,
a second frequency-dividing step to divide the frequency of a reference signal,
a phase comparing step of detecting a phase difference between the frequency-divided signal in said first frequency-dividing step and the frequency-divided signal in said second frequency-dividing step and of outputting a phase difference signal,
a current driving step for inputting and outputting a current generated at a gain which was set depending on the selected band based on said phase difference signal,
a control voltage generation step for generating and outputting a control voltage of said voltage controlled oscillator by increasing or decreasing the control voltage with a specified low-pass filter characteristic by the current inputted and outputted at said current driving step,
a first frequency measurement step in which, under a condition that said voltage-controlled oscillator is set to a selected band and a control voltage of a constant value is applied, said reference signal or the frequency-divided signal of said reference signal and the output signal of said voltage controlled oscillator or the frequency-divided signal thereof are inputted, and based on said reference signal or the frequency-divided signal of said reference signal, the frequency of the output signal of said voltage controlled oscillator or of the frequency-divided signal thereof is measured, and
a band-selection step to select a band in which said voltage-controlled oscillator operates according to the frequency measured in said first frequency measurement step,
wherein when switching over from the first frequency measuring step to the band-selection step, the gain of said current driving step is transiently set high, and after a specified time lapses or after the oscillation frequency of said voltage controlled oscillator is locked in a certain specified range of error with respect to a target frequency, the gain of said current driving step is set to a value corresponding to said selected band.

7. An oscillation frequency control method comprising:
an oscillation step of making a voltage controlled oscillator (VCO) have a plural number of bands oscillate in a selected band, the VCO having an oscillation frequency, the VCO having an output signal, the output signal of the VCO having the oscillation frequency,
a first frequency-dividing step to divide the frequency of the output signal of said voltage controlled oscillator,
a second frequency-dividing step to divide the frequency of a reference signal,
a phase comparing step of detecting a phase difference between the frequency-divided signal in said first frequency-dividing step and the frequency-divided signal in said second frequency-dividing step and of outputting a phase difference signal, a current driving step for inputting and outputting a current generated by a gain which was set depending on the selected band based on said phase difference signal, a control voltage generation step for generating and outputting a control voltage of said voltage controlled oscillator by increasing or decreasing the control voltage with a specified low-pass filter characteristic by the current inputted and outputted at said current driving step, a second frequency measurement step for measuring the oscillation frequency of said voltage controlled oscillator by applying a first constant voltage as said control voltage in the selected band, a third frequency measurement step for measuring the oscillation frequency of said voltage controlled oscillator by applying a second constant voltage as said control voltage in the selected band, a gain setting step to set the gain at said current driving step in the band, based on a difference between the measured oscillation frequency in said second frequency measurement step and the measured oscillation frequency in said third frequency measurement step, and a step to make said voltage controlled oscillator oscillate by inputting and outputting the current generated at the gain that was set based on said phase difference signal in said current driving step, and by applying the output voltage of said control voltage generation step as said control voltage, wherein when switching over from the third frequency measurement step to the step for making said voltage controlled oscillator oscillate by applying the output voltage of said control voltage generation step as said control voltage, the gain of said current driving step is transiently set high, and after a specified time lapse or after the oscillation frequency of said voltage controlled oscillator is locked in a certain specified range of error with respect to a target frequency, the gain of said current driving step is set to a value corresponding to said selected band.

* * * * *